(12) United States Patent
Lee

(10) Patent No.: US 10,937,655 B2
(45) Date of Patent: *Mar. 2, 2021

(54) MEMORY DEVICE WITH VARIOUS PASS VOLTAGES

(71) Applicant: SK hynix Inc., Icheon-si (KR)

(72) Inventor: Hee Youl Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/295,932

(22) Filed: Mar. 7, 2019

(65) Prior Publication Data
US 2019/0206690 A1  Jul. 4, 2019

Related U.S. Application Data

(63) Continuation of application No. 15/651,217, filed on Jul. 17, 2017, now Pat. No. 10,269,570.

(30) Foreign Application Priority Data

Jan. 5, 2017  (KR) .......................... 10-2017-0001875

(51) Int. Cl.
*G11C 16/26* (2006.01)
*G11C 11/56* (2006.01)
(Continued)

(52) U.S. Cl.
CPC ........ *H01L 21/28141* (2013.01); *G06F 12/02* (2013.01); *G06F 12/16* (2013.01);
(Continued)

(58) Field of Classification Search
CPC ......... H01L 21/28141; H01L 29/40114; H01L 29/513; G11C 16/0466; G11C 16/0483;
(Continued)

(56) References Cited

U.S. PATENT DOCUMENTS 8,508,996 B2  8/2013  Kim et al.
8,537,617 B2  9/2013  Kim et al.
(Continued)

FOREIGN PATENT DOCUMENTS

CN  101162609 A  4/2008
CN  102667948 A  9/2012
(Continued)

*Primary Examiner* — Sultana Begum
(74) *Attorney, Agent, or Firm* — William Park & Associates Ltd.

(57) ABSTRACT

Provided herein may be a memory device and a method of operating the same. The memory device may include a memory block including a plurality of pages, and peripheral circuits configured to sequentially program the pages. The memory device may include control logic configured to control the peripheral circuits such that a program voltage is applied to a word line coupled to a page selected from among the pages such that different pass voltages are applied to all or some word lines coupled to pages on which a program operation has been performed among unselected pages other than the selected page, and to word lines coupled to pages on which a program operation has not been performed among the unselected pages.

4 Claims, 21 Drawing Sheets

(51) Int. Cl.
| | |
|---|---|
| *H01L 21/28* | (2006.01) |
| *G06F 12/02* | (2006.01) |
| *G06F 13/42* | (2006.01) |
| *G06F 12/16* | (2006.01) |
| *H01L 29/51* | (2006.01) |
| *G11C 16/04* | (2006.01) |
| *G11C 16/10* | (2006.01) |
| *G11C 16/34* | (2006.01) |
| *G06F 11/07* | (2006.01) |

(52) U.S. Cl.
CPC ...... *G06F 13/4243* (2013.01); *G11C 11/5628* (2013.01); *G11C 16/0466* (2013.01); *G11C 16/0483* (2013.01); *G11C 16/10* (2013.01); *G11C 16/26* (2013.01); *G11C 16/3459* (2013.01); *H01L 29/40114* (2019.08); *H01L 29/513* (2013.01); *G06F 11/076* (2013.01); *G06F 11/0727* (2013.01)

(58) Field of Classification Search
CPC ..... G11C 16/10; G11C 16/3459; G11C 16/26; G11C 16/08; G11C 11/5628; G11C 11/4085; G11C 11/409; G06F 13/4243; G06F 12/16; G06F 12/02; G06F 11/0727; G06F 11/076
See application file for complete search history.

(56) References Cited

U.S. PATENT DOCUMENTS

| | | | |
|---|---|---|---|
| 2007/0159886 | A1 | 7/2007 | Kang |
| 2007/0206421 | A1 | 9/2007 | Mokhlesi |
| 2009/0168576 | A1* | 7/2009 | Fujita ............... G11C 11/404 365/207 |
| 2009/0257280 | A1 | 10/2009 | Oh et al. |
| 2011/0199833 | A1* | 8/2011 | Shim ............... G11C 16/0483 365/185.23 |
| 2011/0261626 | A1 | 10/2011 | Kim |
| 2011/0286274 | A1* | 11/2011 | Chang ............. G11C 16/0483 365/185.17 |
| 2012/0081963 | A1 | 4/2012 | Dutta et al. |
| 2013/0286747 | A1 | 10/2013 | Kwak |
| 2016/0049192 | A1* | 2/2016 | Lee ............... G11C 16/3427 365/185.03 |

FOREIGN PATENT DOCUMENTS

| | | |
|---|---|---|
| CN | 102810332 A | 12/2012 |
| CN | 104425021 A | 3/2015 |
| CN | 105830165 A | 8/2016 |
| KR | 1020110002243 A | 1/2011 |
| KR | 101079350 B1 | 11/2011 |
| KR | 1020130071689 A | 7/2013 |

* cited by examiner

MEMORY DEVICE WITH VARIOUS PASS VOLTAGES

CROSS-REFERENCE TO RELATED APPLICATION

The present application is a continuation application of U.S. patent application Ser. No. 15/651,217, filed on Jul. 17, 2017, and claims priority under 35 U.S.C. § 119(a) to Korean patent application number 10-2017-0001875 filed on Jan. 5, 2017 in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a program operation of the memory device.

2. Related Art

Memory devices are classified into a volatile memory device and a nonvolatile memory device.

The nonvolatile memory device can retain its contents even when power supply is interrupted. Although read and write speeds thereof are relatively low compared to those of the volatile memory device, the nonvolatile memory device is widely used for portable electronic devices because it retains its contents regardless of whether or not it is connected to a power supply.

Examples of a nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM) according to the data storage scheme.

The flash memory may have a two-dimensional (2D) structure in which strings are horizontally arranged on a semiconductor substrate. Alternatively, the flash memory may have a three-dimensional (3D) structure in which strings are vertically stacked on a semiconductor substrate. As the two-dimensional (2D) structure reaches its physical scaling limit, semiconductor manufacturers are producing memory devices that include memory cells vertically stacked on a semiconductor substrate.

SUMMARY

Various embodiments of the present disclosure are directed to a memory device and a method of operating the memory device, which can improve the reliability of a program operation of the memory device.

An embodiment of the present disclosure may provide for a memory device. The memory device may include a memory block including a plurality of pages, peripheral circuits configured to sequentially program the pages, and control logic configured to control the peripheral circuits such that a program voltage is applied to a word line coupled to a page selected from among the pages such that different pass voltages are applied to all or some word lines coupled to pages on which a program operation has been performed among unselected pages other than the selected page, and to word lines coupled to pages on which the program operation has not been performed among the unselected pages.

An embodiment of the present disclosure may provide for a method operating a memory device. The method may include applying a program voltage to a word line coupled to a selected page, applying a first pass voltage to all or some pages on which a program operation has been performed, among unselected pages other than the selected page; and applying a second pass voltage lower than the first pass voltage to pages on which the program operation has not been performed, among the unselected pages.

An embodiment of the present disclosure may provide for a method of operating a memory device. The method may include setting a reference page, determining whether a selected page has reached the reference page, applying the third pass voltage or a fourth pass voltage lower than the third pass voltage to word lines coupled to unselected pages on which the program operation has been performed before the selected page reaches the reference page applying the third pass voltage or a fourth pass voltage lower than the third pass voltage to word lines coupled to unselected pages on which the program operation has been performed, and applying a program voltage to a word line coupled to the selected page, applying the third pass voltage to word lines coupled to unselected pages on which a program operation has not been performed and applying a fifth pass voltage higher than the third pass voltage to word lines coupled to unselected pages on which the program operation has been performed after the selected page has reached the reference page, and applying the program voltage to the word line coupled to the selected page.

DETAILED DESCRIPTION

Figure 1:
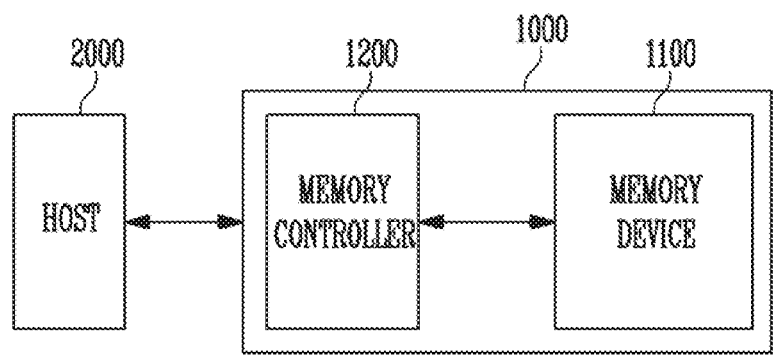
FIG. 1 is a diagram for explaining a memory system according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram for explaining a memory system according to an embodiment of the present disclosure.

Referring to FIG. 1, a memory system 1000 may include a memory device 1100 for storing data and a memory controller 1200 for controlling the memory device 1100 which is under the control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol provided for the purpose of data communication between the host 2000 and the memory system 1000 is to not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information about main memory blocks and sub-memory blocks included in the memory device 1100, and may select the memory device 1100 so that a program operation is performed on a main memory block or a sub-memory block depending on the amount of data that is loaded for the program operation. In an embodiment, the memory device 1110 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM), or a flash memory.

The memory device 1100 may perform a program, read, or erase operation under the control of the memory controller 1200. For example, the memory device 1100 may program memory cells included in a page selected from among a plurality of pages included in the memory device 1100.

Figure 2:
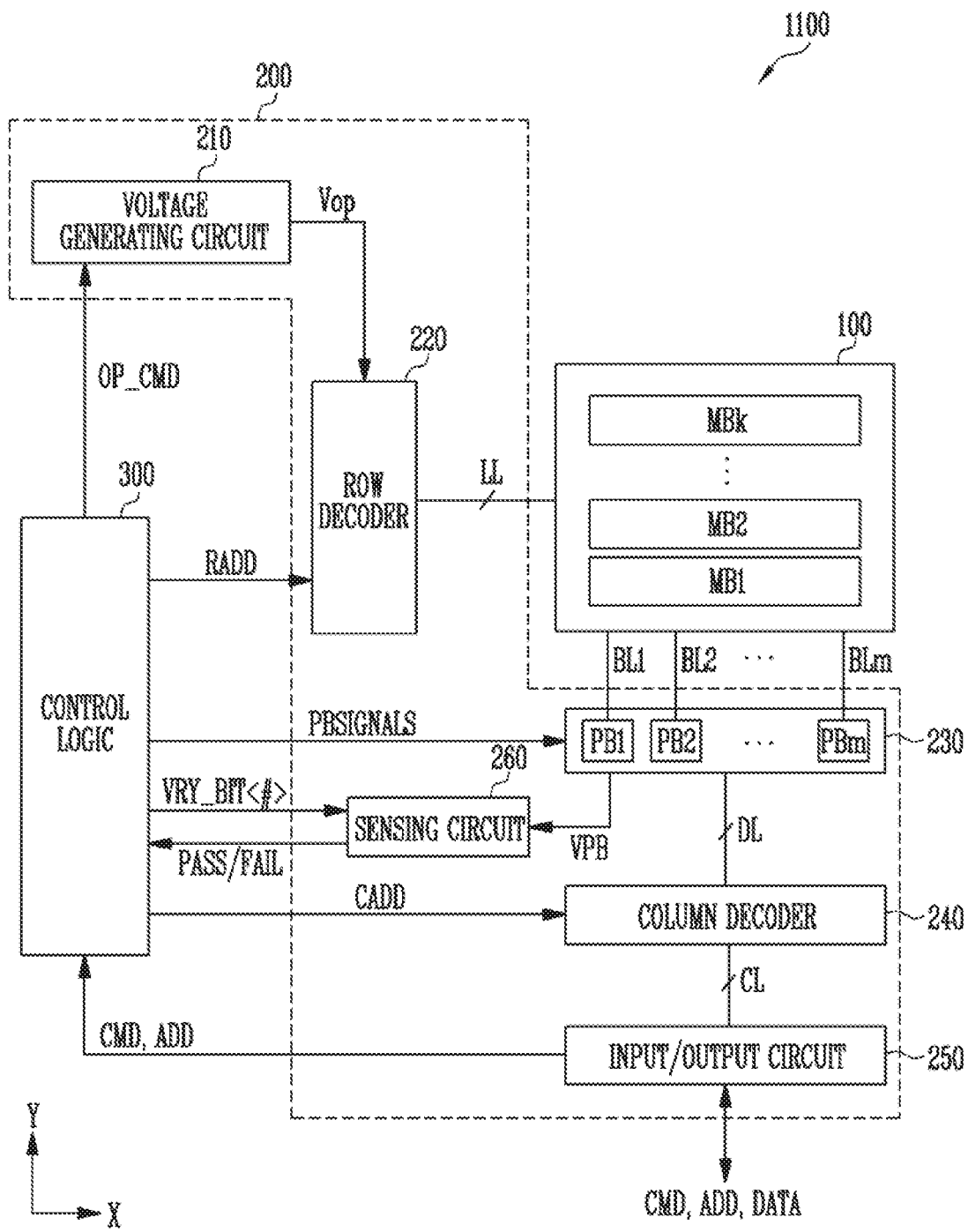
FIG. 2 is a diagram for explaining a memory device of FIG. 1.

FIG. 2 is a diagram for explaining the memory device of FIG. 1.

Referring to FIG. 2, the memory device 1100 may include a memory cell array 100, which stores data. The memory device 1100 may also include peripheral circuits 200, which perform a program operation for storing data in the memory cell array 100, a read operation for outputting stored data, and an erase operation for erasing stored data. The memory device 1100 may include control logic 300, which controls the peripheral circuits 200 under the control of a memory controller (e.g., 1200 of FIG. 1).

The memory cell array 100 may include a plurality of memory blocks MB1 to MBk (where k is a positive integer). Local lines LL and bit lines BL1 to BLm (where m is a positive integer) may be coupled to each of the memory blocks MB1 to MBk. For example, the local lines LL may include word lines, drain and source select lines, and source lines. For example, the local lines LL may further include dummy lines. For example, the local lines LL may further include pipe lines.

The local lines LL may be coupled to the memory blocks MB1 to MBk, respectively, and the bit lines BL1 to BLm may be coupled in common to the memory blocks MB1 to MBk. The memory blocks MB1 to MBk may be implemented in a two-dimensional (2D) or three-dimensional (3D) structure. For example, in memory blocks formed in the 2D structure, pages may be horizontally arranged on a substrate. For example, in memory blocks formed in the 3D structure, pages may be vertically arranged on a substrate.

The peripheral circuits 200 may be configured to perform program, read, and erase operations on a selected memory block under the control of the control logic 300. For example, the peripheral circuits 200 may include a voltage generating circuit 210, a row decoder 220, a page buffer group 230, a column decoder 240, an input/output circuit 250, and a current sensing circuit 260.

The voltage generating circuit 210 may generate various operating voltages Vop to be used for program, read and erase operations in response to an operation signal OP_CMD. For example, the voltage generating circuit 210 may generate a program voltage, a verify voltage, a pass voltage, a read voltage, an erase voltage, a turn-on voltage, etc. under the control of the control logic 300. For example, during a program operation, the voltage generating circuit 210 may generate a first or second pass voltage or first and second pass voltages as a pass voltage to be applied to unselected pages under the control of the control logic 300. For example, the first or second pass voltage may be applied to word lines (e.g., unselected word lines), which are coupled to unselected pages.

The row decoder 220 may transfer the operating voltages Vop to the local lines LL coupled to the selected memory block in response to a row address RADD.

The page buffer group 230 may include a plurality of page buffers PB1 to PBm coupled to the bit lines BL1 to BLm. The page buffers PB1 to PBm may be operated in response to page buffer control signals PBSIGNALS. For example, the page buffers PB1 to PBm may temporarily store data received through the bit lines BL1 to BLm or may sense the voltages or currents of the bit lines BL1 to BLm during a read or a verify operation.

The column decoder 240 may transfer data between the input/output circuit 250 and the page buffer group 230 in response to a column address CADD. For example, the column decoder 240 may exchange data with the page buffers PB through data lines DL or may exchange data with the input/output circuit 250 through column lines CL.

The input/output circuit 250 may transfer a command CMD and an address ADD, received from a memory controller (e.g., 1200 of FIG. 1), to the control logic 300, or may exchange data DATA with the column decoder 240.

During a read operation or a verify operation, the current sensing circuit 260 may generate a reference current in response to an enable bit VRY_BIT<#>, and may compare a sensing voltage VPB received from the page buffer group 230 with a reference voltage, generated by the reference current, and output a pass signal PASS or a fail signal FAIL.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or to failed in response to a pass or fail signal PASS or FAIL. In particular, during a program operation, the control logic 300 may control the voltage generating circuit 210 so that the pass voltage is adjusted depending on whether unselected pages have been programmed. For example, during the program operation, the control logic 300 may control the voltage generating circuit 210 so that a program voltage is applied to a word line (e.g., a selected word line) coupled to a selected page and a pass voltage is applied to word lines (e.g., unselected word lines) coupled to unselected pages. For example, during the program operation, the control logic 300 may control the voltage generating circuit 210 so that the pass voltage is adjusted depending on whether a program operation has previously been performed on unselected pages. For example, during the program operation, the control logic 300 may control the voltage generating circuit 210 so that different pass voltages are applied to unselected pages on which the program operation has previously been performed and unselected pages on which the program operation has not been performed. For example, during the program operation, the control logic 300 may control the voltage generating circuit 210 so that different pass voltages are applied to all or some word lines coupled to unselected pages on which the program operation has already been performed and to word lines coupled to at least some unselected pages on which the program operation has not been performed. For example, during the program operation, the control logic 300 may group the pages based on a reference page and may control the voltage generating circuit 210 so that the pass voltage to be applied to unselected pages is adjusted depending on the group in which a selected page is included.

Figure 3:
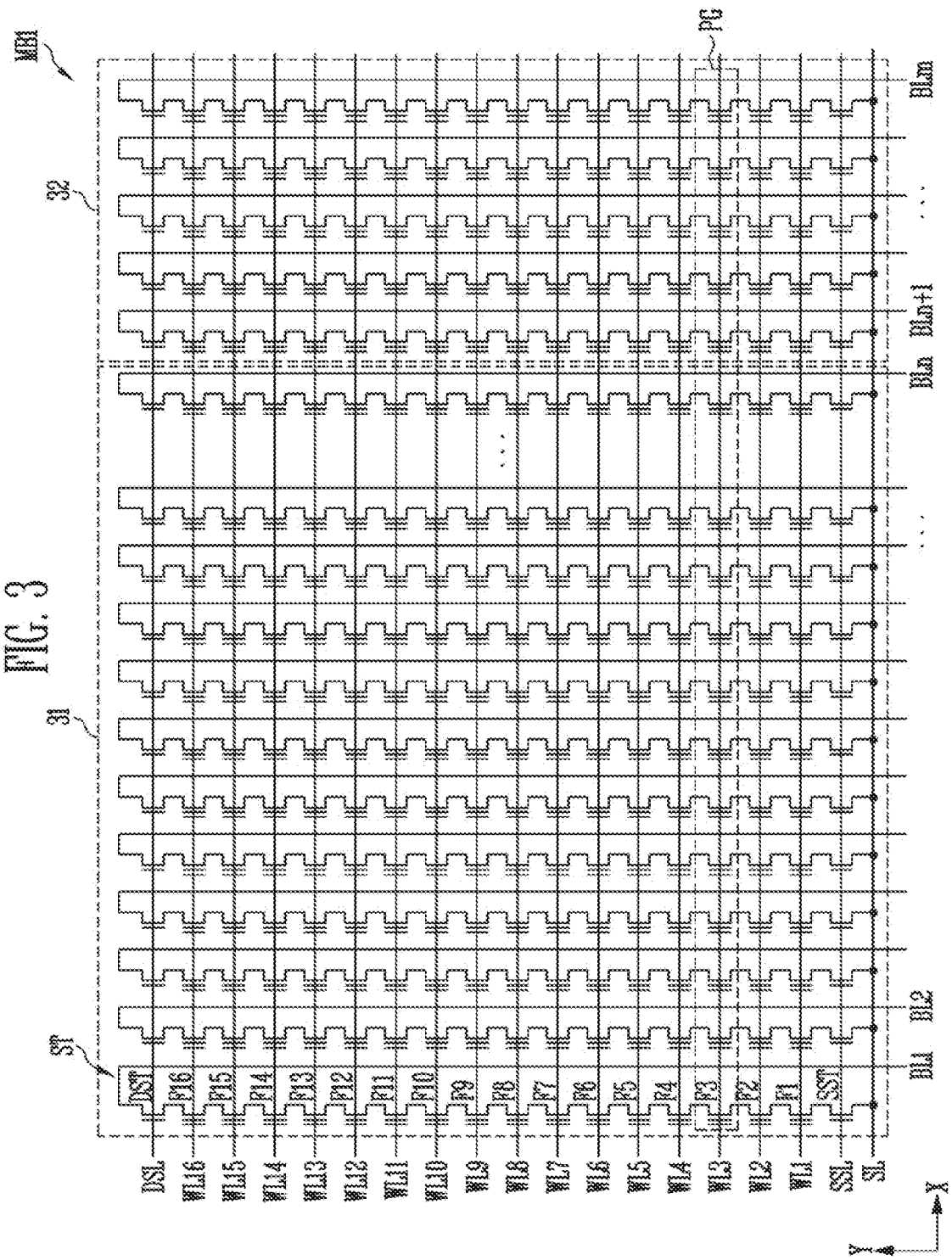
FIG. 3 is a diagram for explaining a memory block of FIG. 2.

FIG. 3 is a diagram for explaining the memory blocks of FIG. 2. Because the memory blocks MB1 to MBk illustrated in FIG. 2 may have a similar configuration as the memory blocks in FIG. 3, a first memory block MB1, among the memory blocks, will be described by way of example.

Referring to FIG. 3, the first memory block MB1 may include a plurality of strings ST coupled between bit lines BL1 to BLm (where m is a positive integer) and a source line SL. The bit lines BL1 to BLm may be coupled to the strings ST, respectively, and the source line SL may be coupled in common to the strings ST. Since the strings ST may have the same configuration, the string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. A single string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F6 may be coupled to a plurality of word lines WL1 to WL16. Among the memory cells included in different strings ST, a group of memory cells coupled to the same word line may be referred to as a page PG. Therefore, a number of pages PG that are identical to the number of word lines WL1 to WL16 may be included in the memory block. Some of the strings ST included in the first memory block MB1 may be included in a normal area 31 in which normal data is stored, and the remaining strings may be included in a flag area 32 in which flag data required for the operation of the memory device 1100 is stored. The normal data may include user data, and the flag data may include information about whether a program operation has already been performed on each page.

Figure 4:
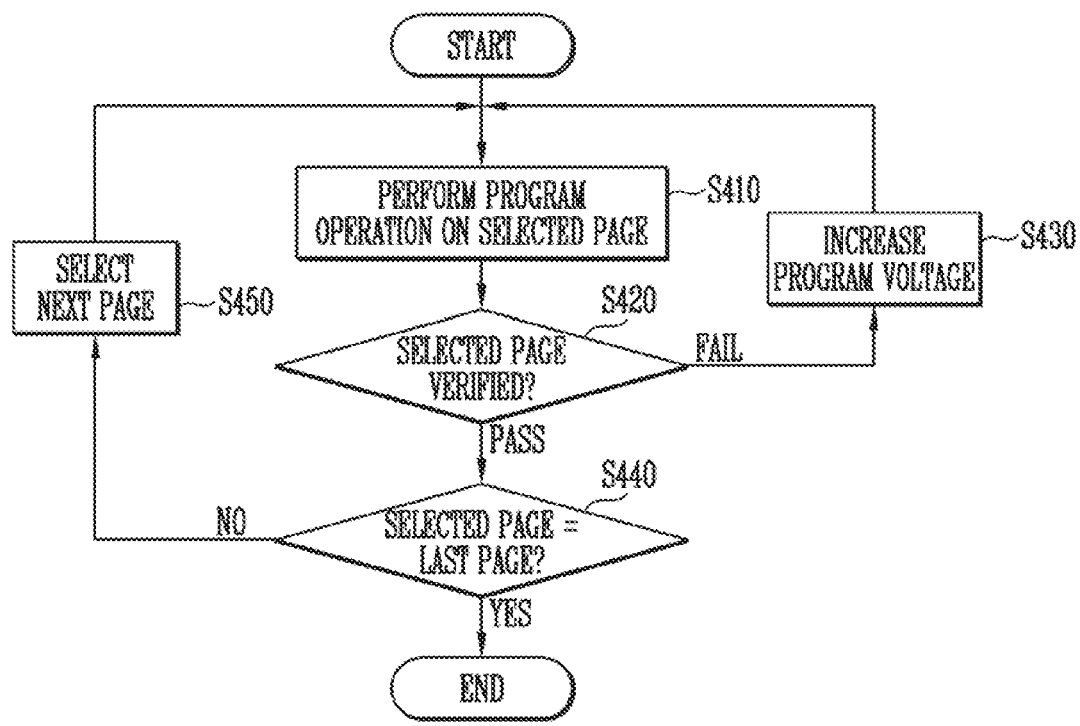
FIG. 4 is a flowchart for explaining a program operation according to an embodiment of the present disclosure.

FIG. 4 is a flowchart for explaining a program operation according to an embodiment of the present disclosure.

Referring to FIG. 4, the memory device 1100 may perform a program operation on selected memory cells in a selected page in response to a program command and an address, which are received from a memory controller (e.g., 1200 of FIG. 1). For example, the program operation may be performed using an incremental step pulse program (ISPP) method of increasing a program voltage by a step voltage. The program operation based on the ISPP method may include the step of programming a selected page, the step of verifying the selected page, and the step of increasing the program voltage if necessary.

The above-described program operation will be described in greater detail below.

At a program operation performance step S410, a program operation may be performed on memory cells selected from among memory cells included in the selected page.

After the program operation has been performed on the selected page for a predetermined period of time, an operation of determining whether the selected page is verified at step S420 may be performed. During the verify operation, it may be determined whether the threshold voltages of the selected memory cells have increased up to a target voltage.

If memory cells having threshold voltages which have not increased up to the target voltage are present among the selected memory cells of the selected page, the verify operation has failed. On the other hand, if the threshold voltages of all of the selected memory cells in the selected page have increased up to the target voltage, the selected memory cells have passed the verify operation.

When the verify operation has failed, the program voltage applied to the selected page is increased at step S430, and the program operation S410 that uses the increased program voltage may be performed. In this way, until the selected page has passed the verify operation, steps S410 to S430 may be repeated.

If the selected page has passed the verify operation, an operation of determining whether the selected page on which the program operation has already been performed is the last page, among program target pages, may be performed at step S440. If it is determined that the selected page is not the last page (in case of "No"), a next page may be selected at step S450, and steps S410 to S450 may be repeated. If it is determined at step S440 that the selected page is the last page, among the program target pages (in case of "Yes"), the program operation of the selected memory block may be terminated.

When, among the above-described operations, the program operation S410 is performed, a pass voltage is applied to unselected pages other than the selected page, and this operation will be described in detail below.

Figure 5:
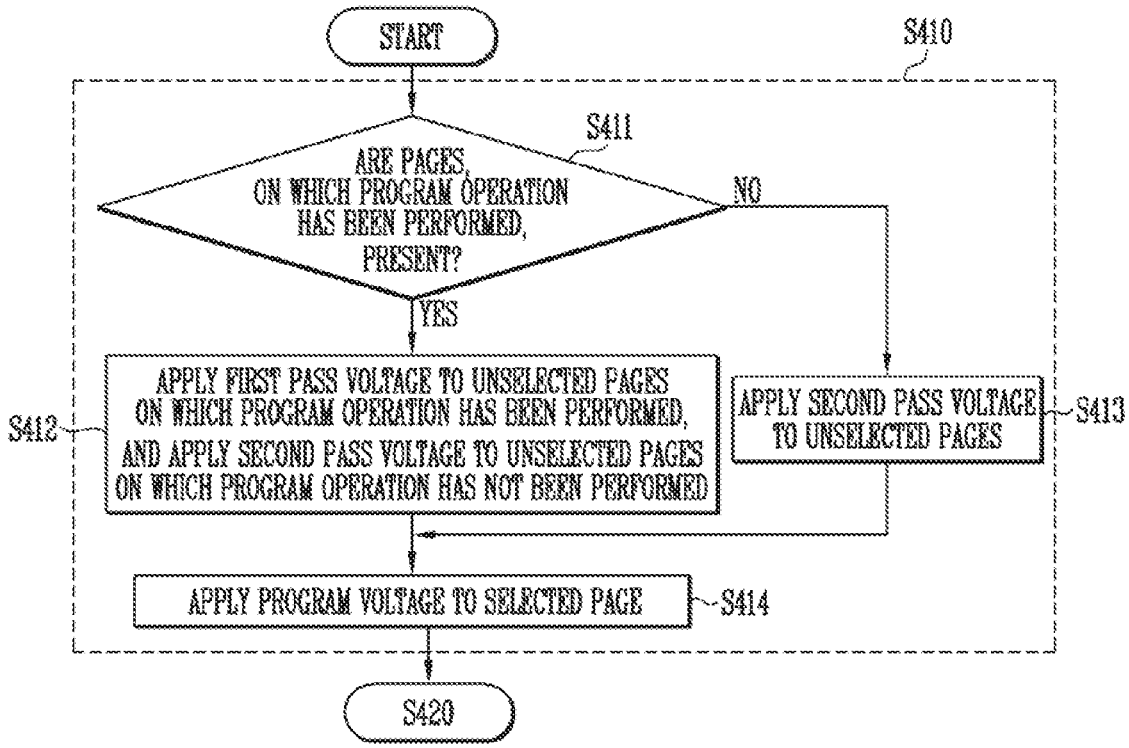
FIG. 5 is a flowchart for explaining in detail the program operation of FIG. 4.

FIG. 5 is a flowchart for explaining the program operation of FIG. 4 in detail.

Referring to FIG. 5, the program operation S410 of FIG. 4 will be described as follows.

When the program operation of a selected memory block starts, an operation of determining whether one or more pages on which the program operation has already been performed are present may be performed at step S411. For example, the pages on which the program operation has already been performed may be determined based on data stored in flag cells of respective pages. For example, in the flag cells included in the pages, data related to the states of respective pages, such as information about whether the program operation has previously been performed on respective pages, and programmed logical page information (e.g., a lower bit or an upper bit), may be stored.

If it is determined at step S411 that no page on which the program operation has previously been performed is present (in case of "No") in the memory block, the peripheral circuits 200 may be controlled such that a second pass voltage may be applied to word lines coupled to the unselected pages at step S413. For example, when no page on which the program operation has previously been performed is present in the selected memory block, the selected page may be a program target page that is selected first from the selected memory block. Here, the second pass voltage that is applied to the unselected pages may be applied to word lines (e.g., unselected word lines) coupled to the unselected pages. Then, the program voltage may be applied to the selected page at step S414 and a program operation may be performed on the selected memory cells. Here, the program voltage applied to the selected page may be applied to a word line (e.g., a selected word line) coupled to the selected page.

If it is determined at step S411 that pages on which the program operation has previously been performed are present (in case of "Yes") in the memory block, the control logic 300 may control the peripheral circuits 200 to apply different pass voltages to unselected pages on which the program operation has not been performed and to unselected pages on which the program operation has previously been performed.

For example, the control logic 300 may control the peripheral circuits 200 to apply a first pass voltage to all or some unselected pages via word lines coupled to unselected pages on which the program operation has already been performed, and a second pass voltage lower than the first pass voltage may be applied to unselected pages via word lines coupled to the unselected pages on which the program operation has not been performed at step S412. For example, both the first and second pass voltages may be set to positive voltages higher than 0 V, and may be applied to word lines of the unselected pages. For example, the first pass voltage may be set to a voltage that is higher than the second pass voltage and is lower than the program voltage. In other words, the second pass voltage may be set to a voltage between 0 V and the first pass voltage. Alternatively, the first pass voltage may be applied to some of the unselected pages on which the program operation has already been performed, and the second pass voltage lower than the first pass voltage may be applied to some of the unselected pages on which the program operation has not been performed. For example, when the first pass voltage is applied to some of the unselected pages on which the program operation has previously been performed, and the second pass voltage is applied to some of the unselected pages on which the program operation has not been performed, an additional pass voltage differing from the first and second pass voltages may be applied to the remaining pages. Here, the additional pass voltage differing from the first and second pass voltages may be a pass voltage set to a default in the memory device. Then, the program voltage may be applied to the selected page, and thus the program operation may be performed on the selected memory cells at step S414.

In this way, a higher pass voltage is applied to all or some of the unselected pages on which the program operation has previously been performed than that of the unselected pages on which the program operation has not been performed, thus preventing channels from being disconnected on the pages on which the program operation has previously been performed. That is, because the memory cells on which the program operation has previously been performed have threshold voltages higher than those of memory cells on which the program operation has not been performed, a higher pass voltage is required to form channels. Therefore, as described above, a relatively high voltage (e.g., the first pass voltage) is applied to all or some of the pages on which the program operation has previously been performed, thus preventing channels from being disconnected and reducing the occurrence of a program disturb phenomenon in an area including the unselected pages.

The above-described program operation will be described in more detail below.

FIGS. 6 to 9 are diagrams for explaining examples of the program operation of FIG. 5.

Figure 6:
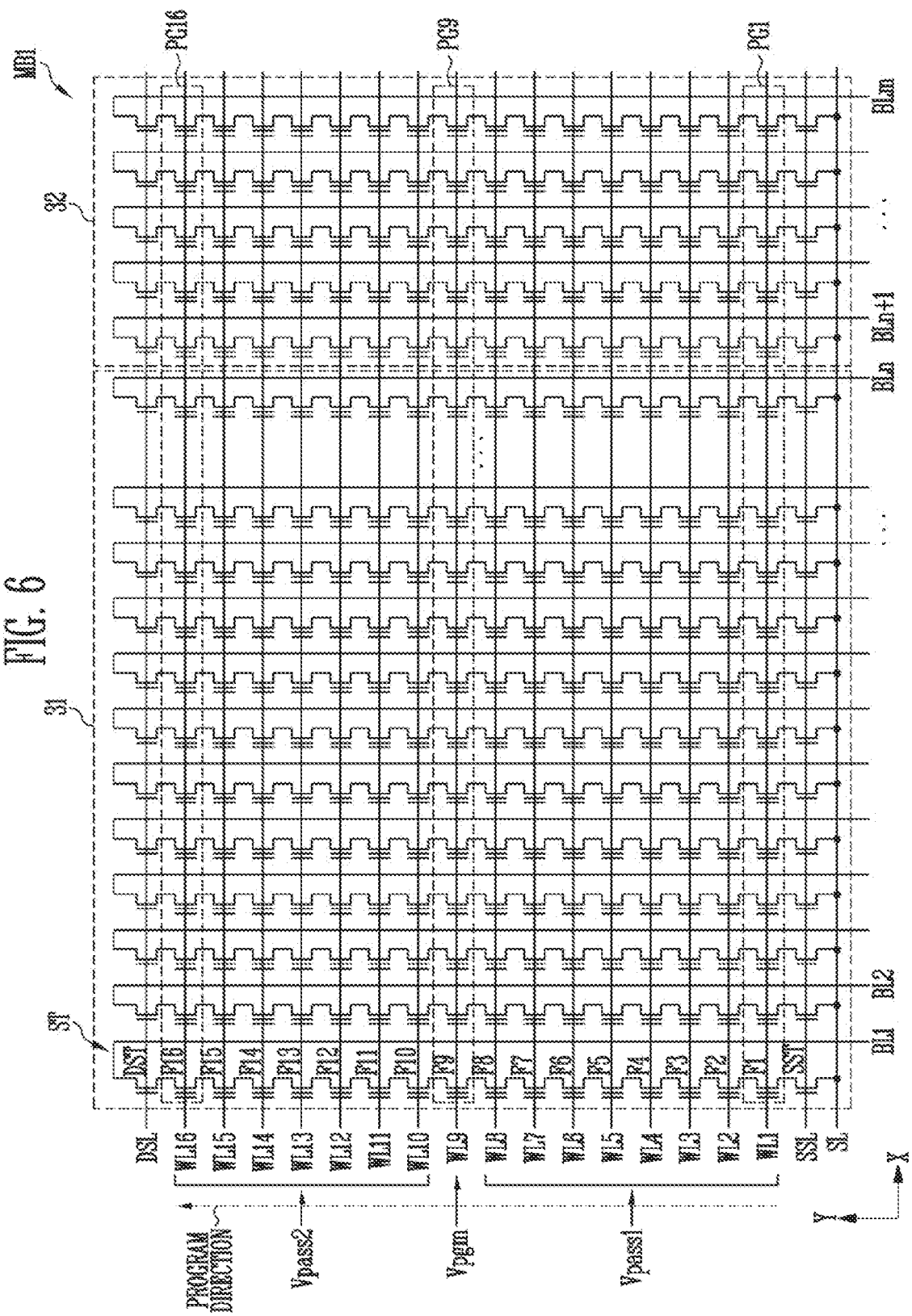
FIGS. 6 to 9 are diagrams for explaining examples of the program operation of FIG. 5.

FIG. 6 is a diagram for explaining an example in which a program operation is performed in the direction from a source select line SSL to a drain select line DSL.

Referring to FIG. 6, a first page PG1 may be arranged adjacent to the source select line SSL and a sixteenth page PG16 may be arranged adjacent to the drain select line DSL. Although 16 pages are illustrated as being included in a first memory block MB1 in FIG. 6, this illustration corresponds only to a drawing for explaining an example of a program operation according to the present disclosure, and thus the number of pages is not limited thereto.

Assuming that a ninth page PG9 is the selected page, the remaining first to eighth pages and tenth to sixteenth pages are unselected pages. When a program operation is performed in the direction from the first page PG1 to the sixteenth page PG16, the first to eighth pages may be unselected pages on which the program operation has already been performed, and the tenth to sixteenth pages may be unselected pages on which the program operation has not been performed.

During the program operation of the selected page PG9, a first pass voltage Vpass1 may be applied to word lines WL1 to WL8 coupled to the unselected pages on which the program operation has already been performed, and a second pass voltage Vpass2 lower than the first pass voltage Vpass1 may be applied to word lines WL10 to WL16 coupled to the unselected pages on which the program operation has not been performed. A program voltage Vpgm may be applied to a word line WL9 coupled to the selected page PG9, and thus the program operation may be performed on the selected page.

An example in which the sequence of the program operation differs from that of the above-described example will be described below.

Figure 7:
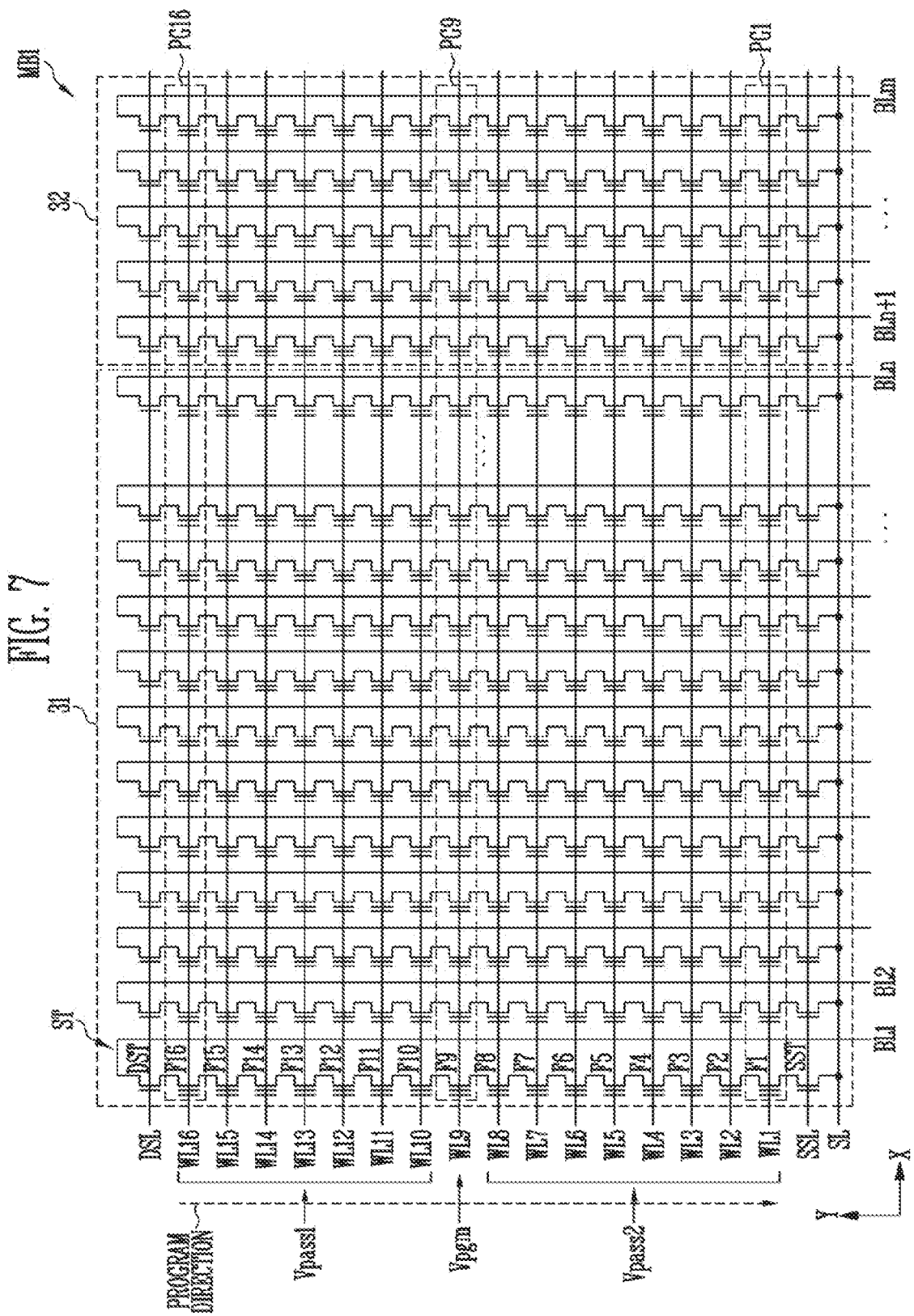

FIG. 7 is a diagram for explaining an example in which a program operation is performed in the direction from a drain select line DSL to a source select line SSL.

Referring to FIG. 7, when the program operation is sequentially performed in the direction from a sixteenth page PG16 to a first page PG1, and a selected page is a ninth page PG9, the sixteenth to tenth pages may be unselected pages on which the program operation has already been performed, and eighth to first pages may be unselected pages on which the program operation has not been performed.

During the program operation of the selected page PG9, the first pass voltage Vpass1 may be applied to word lines WL16 to WL10 coupled to the unselected pages on which the program operation has already been performed, and the second pass voltage Vpass2 lower than the first pass voltage Vpass1 may be applied to word lines WL8 to WL1 coupled to the unselected pages on which the program operation has not been performed. The program voltage Vpgm may be applied to a word line WL9 coupled to the selected page PG9, and thus the program operation may be performed on the selected page.

An example in which dummy cells are included in strings ST will be described below.

Figure 8:
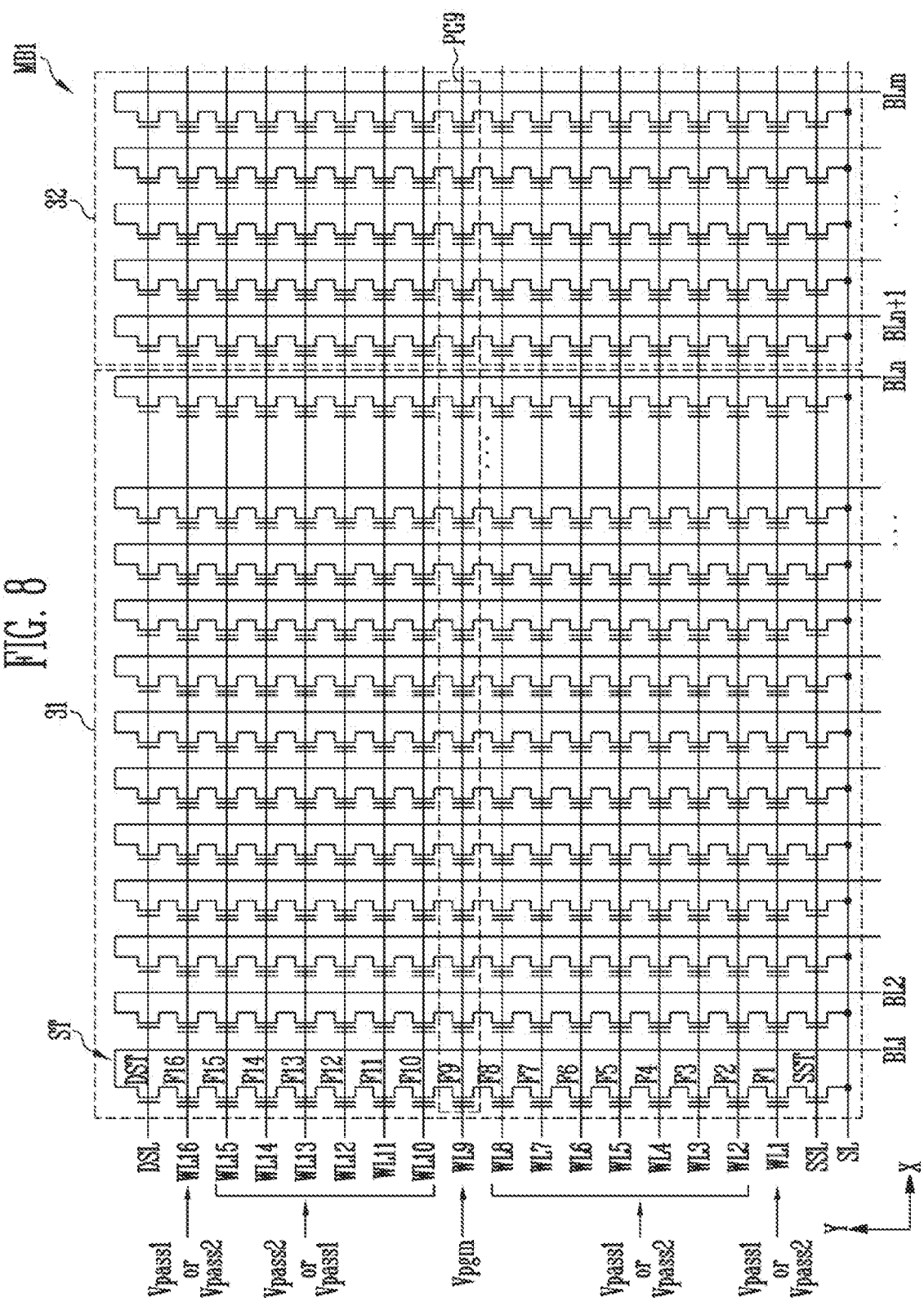

FIG. 8 is a diagram for explaining a program operation of a memory block MB1 including dummy cells.

Referring to FIG. 8, each of strings ST may include one or more dummy cells. For example, the dummy cells may be arranged adjacent to a source select transistor SST and may be arranged adjacent to a drain select transistor DST. Alternatively, the dummy cells may be arranged between memory cells. In FIG. 8, an embodiment in which dummy cells F1 and F16 are arranged adjacent to the source and drain select transistors SST and DST will be described below.

During the program operation of the selected page PG9, the first or second pass voltage Vpass1 or Vpass2 may be applied to unselected word lines WL2 to WL8 and WL10 to WL15 depending on whether a program operation has been previously performed on the unselected pages (see FIGS. 6 and 7), and the program voltage Vpgm may be applied to a selected word line WL9. Here, the first or second pass voltage Vpass1 or Vpass2 may be applied to dummy lines WL1 and WL16 coupled to gates of the dummy cells F1 and F16. For example, when the dummy cells F1 and F16 have already been programmed and the threshold voltages thereof have increased, the first pass voltage Vpass1 may be applied to the dummy lines WL1 and WL16. If the dummy cells F1 and F16 have been erased, the second pass voltage Vpass2 lower than the first pass voltage Vpass1 may be applied to the dummy lines WL1 and WL16.

Figure 9:
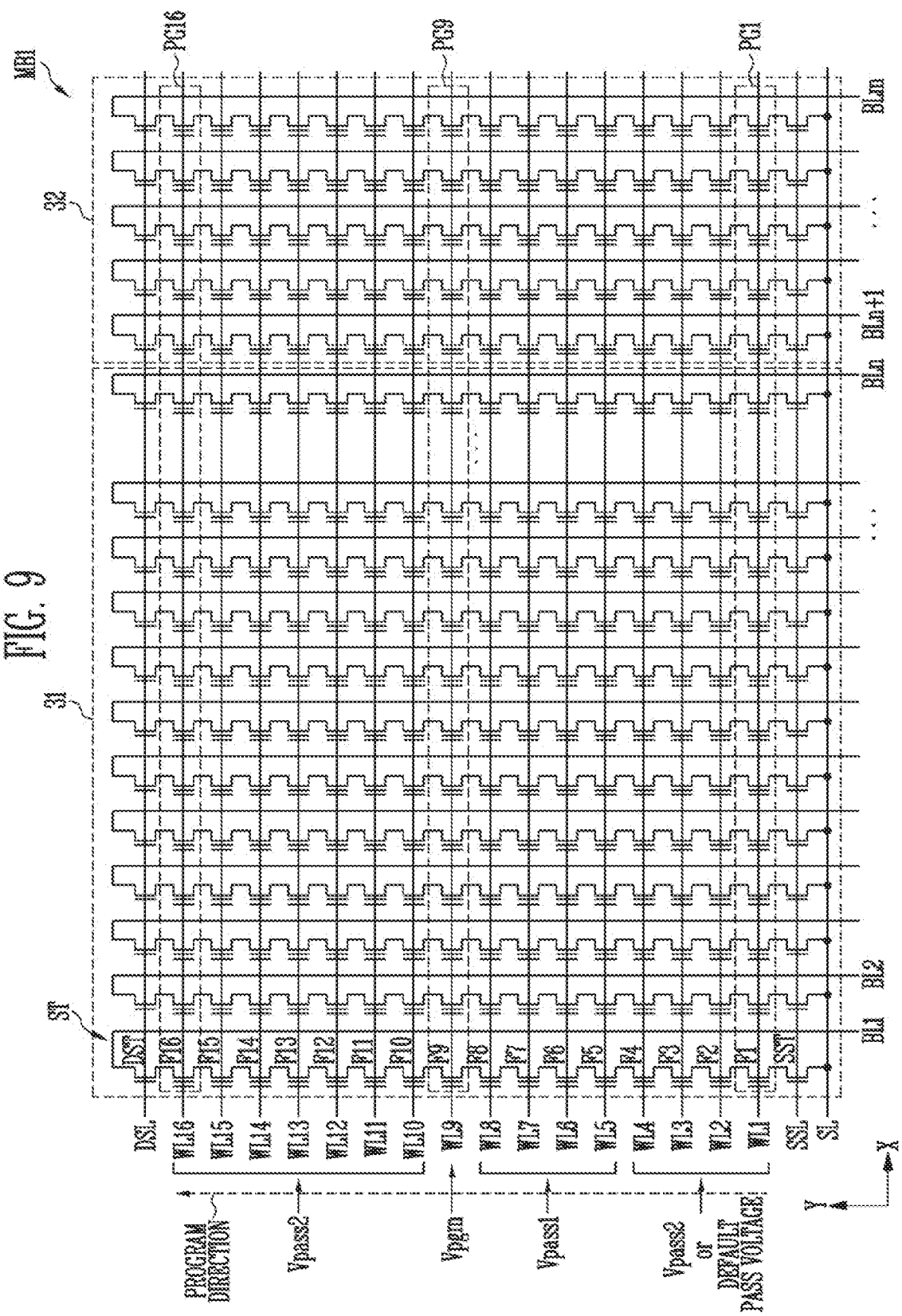

FIG. 9 is a diagram for explaining an example in which a program operation is performed in the direction from a source select line SSL to a drain select line DSL.

Referring to FIG. 9, a first page PG1 may be arranged adjacent to the source select line SSL, and a sixteenth page PG16 may be arranged adjacent to the drain select line DSL. Although 16 pages are illustrated as being included in a first memory block MB1 in FIG. 9, this illustration corresponds only to a drawing for explaining an example of a program operation according to the present disclosure, and thus the number of pages is not limited thereto.

Assuming that the ninth PG9 is a selected page, the remaining first to eighth pages and tenth to sixteenth pages may be unselected pages. When the program operation is performed in the direction from the first page PG1 to the sixteenth page PG16, the first to eighth pages may be unselected pages on which the program operation has already been performed, and the tenth to sixteenth pages may be unselected pages on which the program operation has not been performed.

During the program operation of the selected page PG9, the first pass voltage Vpass1 may be applied to some of the word lines WL1 to WL8 coupled to the unselected pages on which the program operation has already been performed, and the second pass voltage Vpass2 lower than the first pass voltage Vpass1 may be applied to word lines WL10 to WL16 coupled to the unselected pages on which the program operation has not been performed. For example, the first pass voltage Vpass1 may be applied to the fifth to eighth word lines WL5 to WL8, among the word lines WL1 to WL8 coupled to the unselected pages on which the program operation has already been performed, and the second pass voltage Vpass2 or a default pass voltage may be applied to the remaining first to fourth word lines WL1 to WL4. The program voltage Vpgm may be applied to the ninth word line WL9 coupled to the selected page PG9, and thus the program operation may be performed on the selected page.

FIG. 9 is intended to describe an example in which the first pass voltage Vpass1 is applied only to some word lines coupled to pages, among pages on which the program operation has been completed. Accordingly, among word lines coupled to the pages on which the program operation has been completed, word lines to which the first pass voltage Vpass1 is to be applied may vary depending on the memory device.

Figure 10:
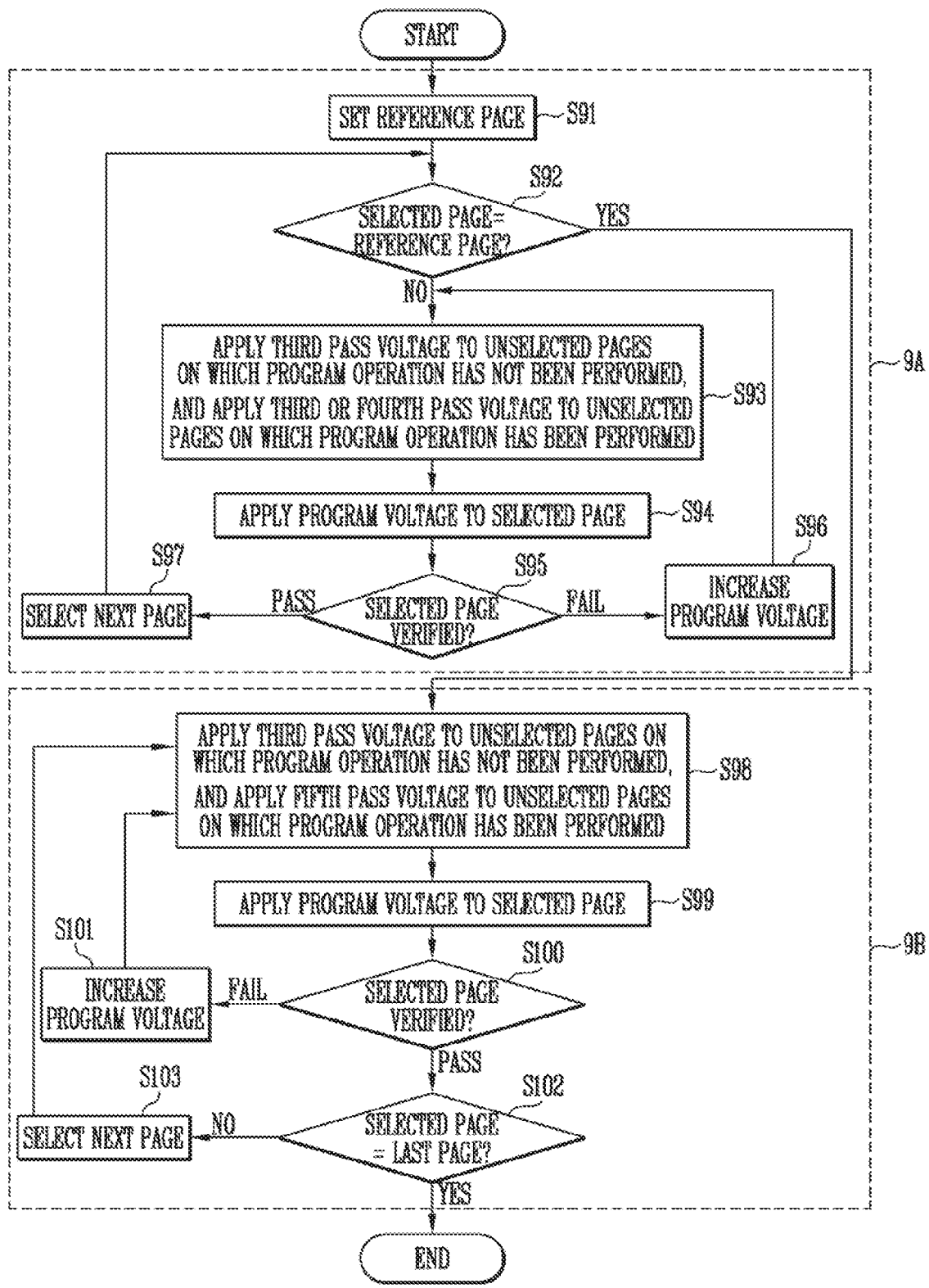
FIG. 10 is a flowchart for explaining a program operation according to an embodiment of the present disclosure.

FIG. 10 is a flowchart for explaining a program operation according to an embodiment of the present disclosure.

Referring to FIG. 10, a program operation according to an embodiment of the present disclosure may be divided into operation 9A performed before a selected page reaches a reference page, and an operation 9B performed after the selected page has reached the reference page.

The reference page may be set in consideration of the time required for the threshold voltages of programmed memory cells to be stabilized. In detail, after the memory cells have been programmed and the threshold voltages thereof have increased, the threshold voltages may be unstable for a predetermined period of time. For example, the memory cells may enter an unstable state in which electrons trapped in the memory cells can easily move due to an external voltage for a predetermined period of time, but, after the predetermined period of time has passed, the memory cells may enter a stable state in which the movement of the electrons is suppressed. Therefore, the time required for the memory cells to enter the stable state is measured by performing a test operation, and the reference page may be set based on the measured time. For example, the reference page may be set in consideration of the time required for memory cells included in a first page to be stabilized, or may be set in consideration of the time required for memory cells included in a second page or an N-th (where N is a positive integer) page to be stabilized.

Information about the reference page may be stored in the memory controller (e.g., 1200 of FIG. 1), the control logic (e.g., 300 of FIG. 2), or flag cells included in the flag area (e.g., 32 of FIG. 3) of a memory block.

When the reference page information is stored in the memory controller (e.g., 1200 of FIG. 1), the memory controller (e.g., 1200 of FIG. 1) may transmit the reference page information together with a program target address when transmitting the program target address to the memory device 1100, and the memory device (e.g., 1100 of FIG. 2) may perform a program operation based on the received information.

When the reference page information is stored in the control logic (e.g., 300 of FIG. 2), the control logic (e.g., 300 of FIG. 2) may control the voltage generating circuit (e.g. 210 of FIG. 2) so that either or both of the first and second pass voltages may be output based on the reference page information.

When the reference page information is stored in the flag area (e.g., 32 of FIG. 3) of the memory block, the control logic (e.g., 300 of FIG. 2) may obtain the reference page information by reading the information from the flag cells included in the flag area (e.g., 32 of FIG. 3), and may control the peripheral circuits (e.g., 200 of FIG. 2) based on the reference page information.

A program operation that uses reference page information will be described in detail below.

When the reference page is set, the reference page information may be stored in the memory controller (e.g., 1200 of FIG. 1) or the memory device (e.g., 1100 of FIG. 1) at step S91. The control logic 300 may control peripheral circuits 200 to perform an operation of determining whether a selected page that is the target to be programmed is the reference page may be performed at step S92. If it is determined that the selected page is not the reference page before the selected page reaches the reference page (in case of "No"), a third pass voltage may be applied to unselected pages via word lines coupled to the unselected pages on which a program operation has not been performed, and the third pass voltage or a fourth pass voltage lower than the third pass voltage may be applied to unselected pages via word lines coupled to unselected pages on which the program operation has previously been performed at step S93. Here, the third pass voltage or the fourth pass voltage may be applied to word lines of the unselected pages. Then, the program voltage may be applied to the selected page at step S94. Here, the program voltage may be applied to the word line coupled to the selected page. Next, a verify operation may be performed on the memory cells included in the selected page at step S95.

When the verify operation has failed, the program voltage is increased at step S96, and steps S93 to S96 may be repeated until the verify operation has passed.

When the verify operation has passed, a next page is selected at step S97, steps S92 to S97 may be repeated until the selected page becomes the reference page.

If it is determined at step S92 that the selected page is the reference page (in case of "Yes"), the control logic 300 may control the peripheral circuits 200 so that the third pass voltage may be applied to unselected pages via word lines coupled to unselected pages on which the program operation has not been performed, and a fifth pass voltage higher than the third pass voltage may be applied to unselected pages via word lines coupled to unselected pages on which the program operation has previously been performed at step S98. For example, the third, fourth, and fifth pass voltages may be set to voltages that are higher than 0 V and are lower than the program voltage. The third pass voltage may be set to a voltage that is higher than the fourth pass voltage and is lower than the fifth pass voltage. Here, the third or fifth pass voltage may be applied to the word lines of the unselected pages. Then, the program voltage may be applied to the selected page at step S99. Here, the program voltage may be applied to the word line coupled to the selected page. Next, a verify operation may be performed on the memory cells included in the selected page at step S100.

If the verify operation has failed, the program voltage is increased at step S101, and steps S98 to S101 may be repeated until the verify operation has passed.

If the verify operation has passed, an operation of determining whether the selected page is the last page may be performed at step S102. For example, it may be determined whether the page selected from among the program target pages included in the selected memory block is the last page.

If the selected page is not the last page (in case of "No"), a next page is selected at step S103, and steps S98 to S103 may be repeated.

If the selected page is the last page (In case of "Yes"), the program operation of the selected memory block may be terminated.

Figure 11:
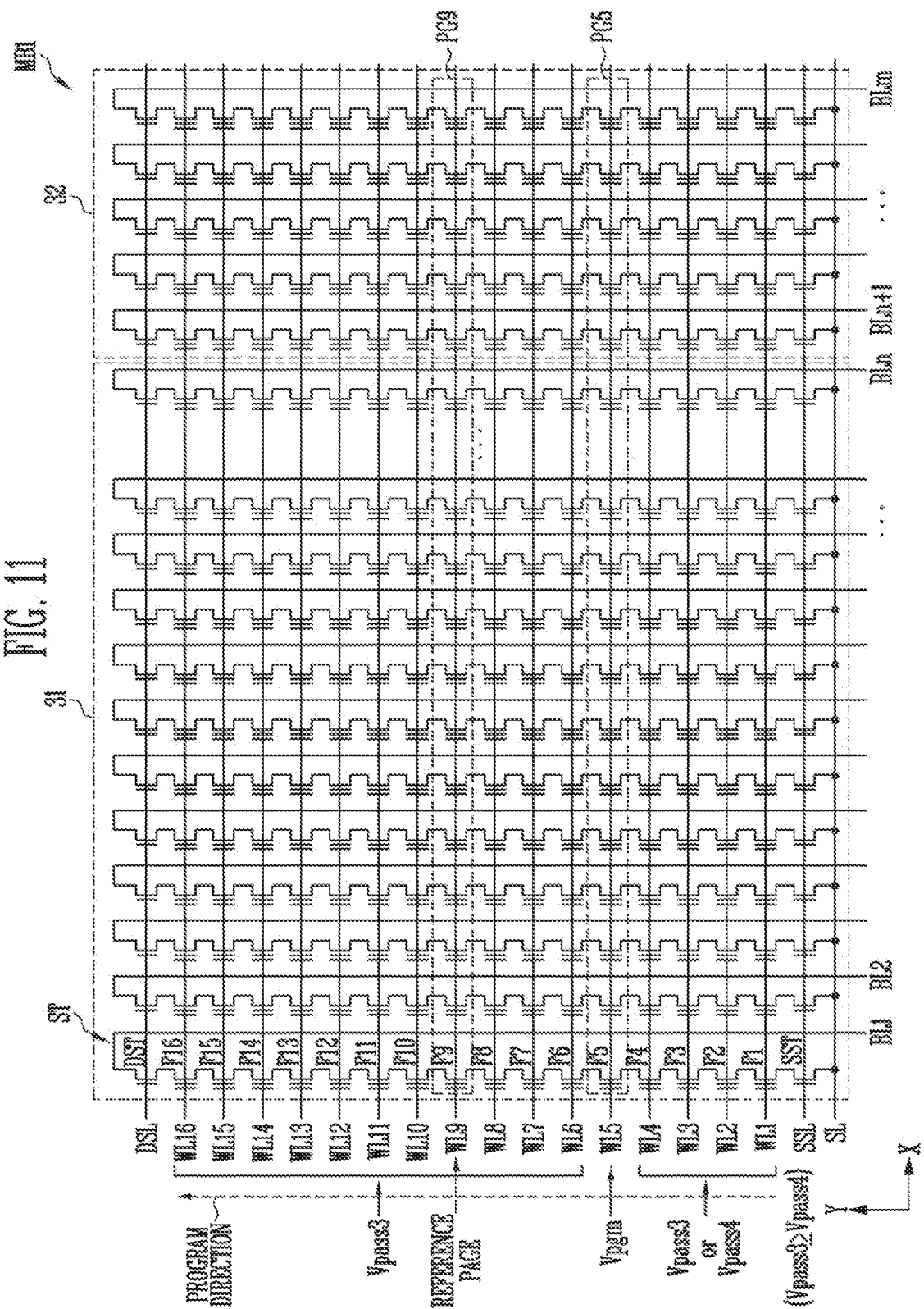
FIGS. 11 and 12 are diagrams for explaining examples of the program operation of FIG. 10.
Figure 12:
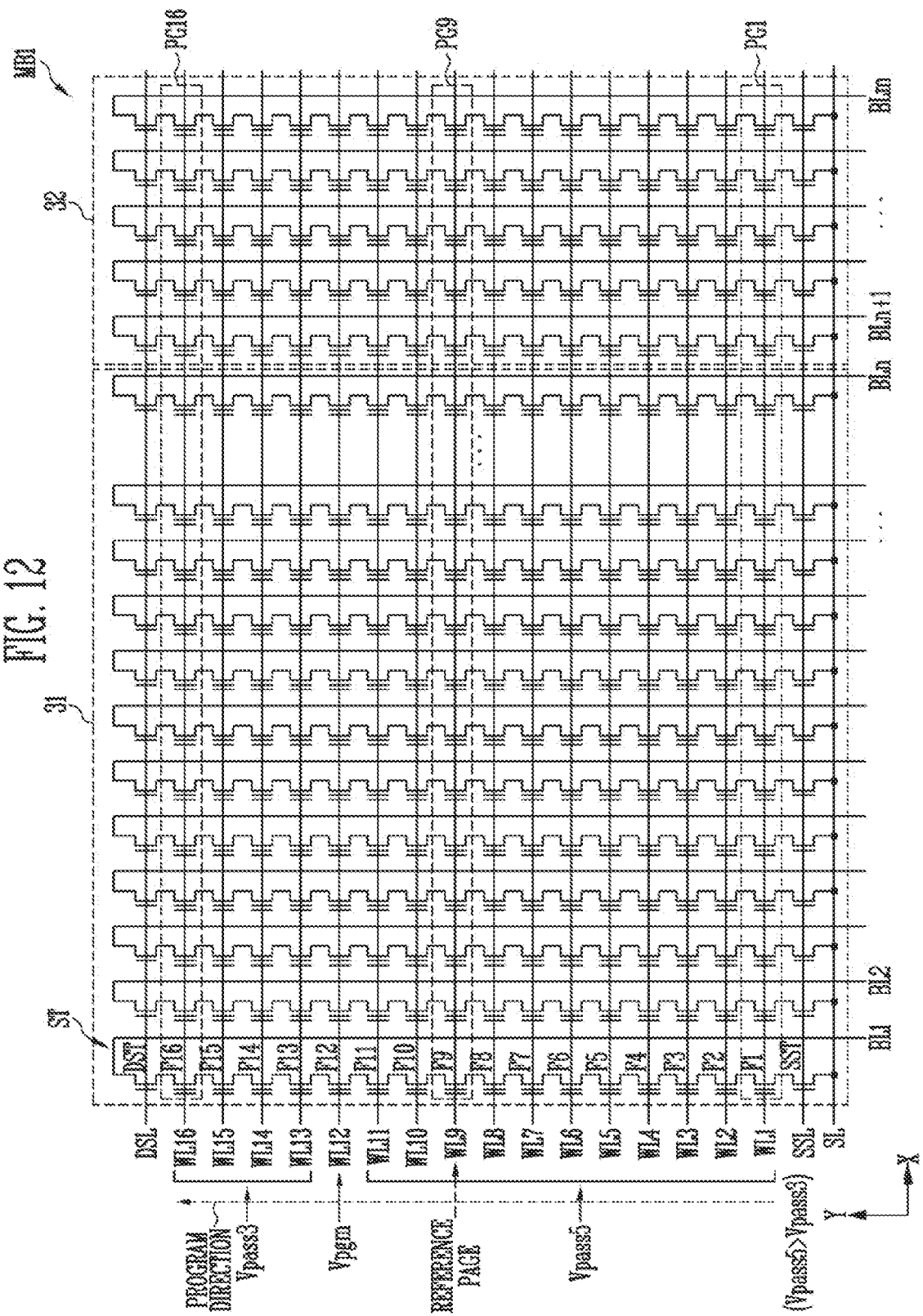

FIGS. 11 and 12 are diagrams for explaining examples of the program operation of FIG. 10.

FIG. 11 is a diagram for explaining a program operation performed before a selected page reaches a reference page.

Referring to FIG. 11, it is assumed that a program direction is the direction from a source select line SSL to a drain select line DSL, and the reference page is a ninth page PG9. Here, because the program operation is sequentially performed from a first page, the program operation 9A of FIG. 10 may be performed when the selected page is included in first to eighth pages, and the program operation 9B of FIG. 10 may be performed when the selected page is included in the ninth to sixteenth pages.

In FIG. 11, an example in which the selected page is a fifth page PG5 is illustrated, and thus this corresponds to a case where the selected page has not reached the reference page. Therefore, the third or fourth pass voltage Vpass3 or Vpass4 may be applied to word lines WL1 to WL4 coupled to pages on which the program operation has previously been performed, and the third pass voltage Vpass3 may be applied to word lines WL6 to WL16 coupled to pages on which a program operation has not been performed. The program voltage Vpgm may be applied to a word line WL5 coupled to the selected page, and thus the program operation may be performed on the selected page.

FIG. 12 is a diagram for explaining a program operation performed after the selected page has reached the reference page.

Referring to FIG. 12, an example in which the selected page is a twelfth page is illustrated. That is, because the selected page is included in ninth to sixteenth pages PG9 to PG16, a program operation (e.g., 9B of FIG. 10) performed after the selected page has reached the reference page may be performed. For example, the fifth pass voltage Vpass5 may be applied to word lines WL1 to WL11 coupled to pages on which the program operation has previously been performed, and the third pass voltage Vpass3 may be applied to word lines WL13 to WL16 coupled to pages on which a program operation has not been performed. The program voltage Vpgm may be applied to the word line WL12 coupled to the selected page, and thus the program operation may be performed on the selected page.

The above-described program operation may also be applied to a 3D memory device vertically arranged on a substrate. In relation to this, a description will be made with reference to the following drawings.

Figure 13:
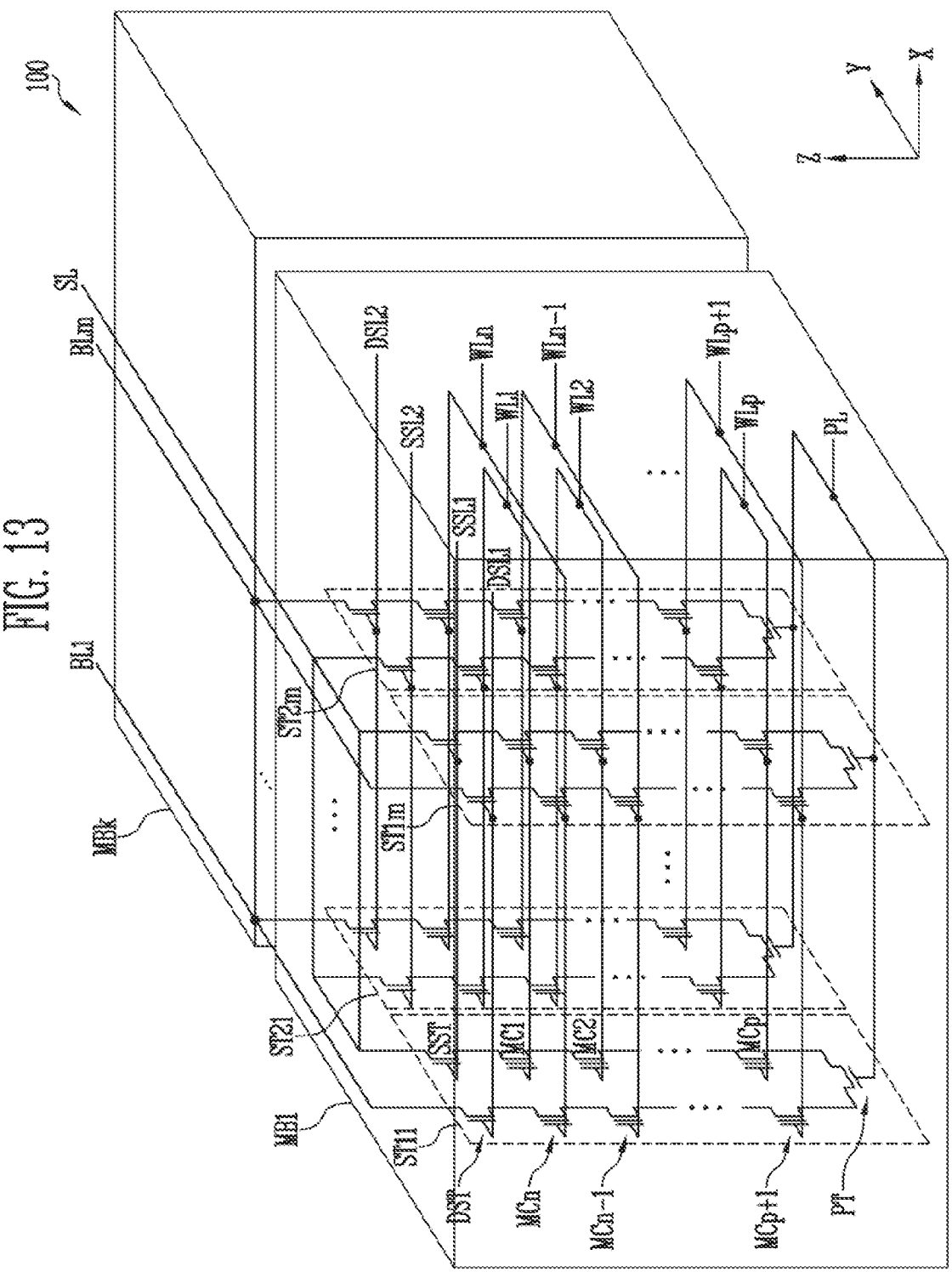
FIG. 13 is a diagram for explaining an embodiment of a 3D memory block.

FIG. 13 is a diagram for explaining an embodiment of a 3D memory block.

Referring to FIG. 13, a memory cell array 100 may include a plurality of memory blocks MB1 to MBk. The internal configuration of the first memory block MB1 is illustrated in FIG. 13 to help with an understanding of the disclosure, and the internal configuration of the remaining memory blocks MB2 to MBk is omitted. The second to k-th memory blocks MB2 to MBk may have the same configuration as the first memory block MB1.

The first memory block MB1 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (i.e., an X direction). In FIG. 13, two strings are illustrated as being arranged in a column direction (i.e., a Y direction). However, this illustration is made for the convenience of description, and three or more strings may be arranged in the column direction.

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. In an embodiment, each of the source and drain select transistors SST and DST and the memory cells MC1 to MCn may include a channel layer, a tunnel insulating layer, a charge trap layer, and a blocking insulating layer. For example, a pillar for providing the channel layer may be provided to each string. In an embodiment, a pillar for providing at least one of the channel layer, the tunnel insulating layer, the charge trap layer, and the blocking insulating layer may be provided to each string.

The source select transistor SST of each string may be coupled between a source line SL and memory cells MC1 to MCp.

In an embodiment, the source select transistors of strings arranged in the same row may be coupled to a source select line extended in a row direction, and source select transistors of strings arranged in different rows may be coupled to different source select lines. In FIG. 13, the source select transistors of the strings ST11 to ST1m in a first row may be coupled to a first source select line SSL1. The source select transistors of the strings ST21 to ST2m in a second row may be coupled to a second source select line SSL2.

In another embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+i-th to n-th memory cells MCp+1 to MCn. The first to p-th memory cells MC1 to MCp may be sequentially arranged in a Z direction and may be connected in series between the source select transistor SST and the pipe transistor PT. The p+1-th to n-th memory cells MCp+1 to MCn may be sequentially arranged in the Z direction and may be connected in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data stored in the memory block MB1 may be improved.

A gate of the pipe transistor PT of each string may be coupled to a pipeline PL.

The drain select transistor DST of each string may be coupled between the corresponding bit line and the memory cells MCp+1 to MCn. The strings arranged in a row direction may be coupled to drain select lines extended in the row direction. The drain select transistors of the strings ST11 to ST1m in a first row may be coupled to a first drain select line DSL1. The drain select transistors of the strings ST21 to ST2m in a second row may be coupled to a second drain select line DSL2.

The strings arranged in a column direction may be coupled to bit lines extended in the column direction. In FIG. 13, the strings ST11 and ST21 in a first column may be coupled to a first bit line BL1. The strings ST1m and ST2m in an m-th column may be coupled to an m-th bit line BLm.

Memory cells coupled to the same word line, among strings arranged in a row direction, constitute a single page. For example, memory cells coupled to the first word line WL1, among the strings ST11 to ST1m in the first row, may constitute a single page. Memory cells coupled to the first word line WL1, among the strings ST21 to ST2m in the second row, may constitute a single additional page. The strings arranged in the direction of a single row may be selected by selecting any one of the drain select lines DSL1 and DSL2. A single page may be selected from the selected strings by selecting any one of the word lines WL1 to WLn.

Figure 14:
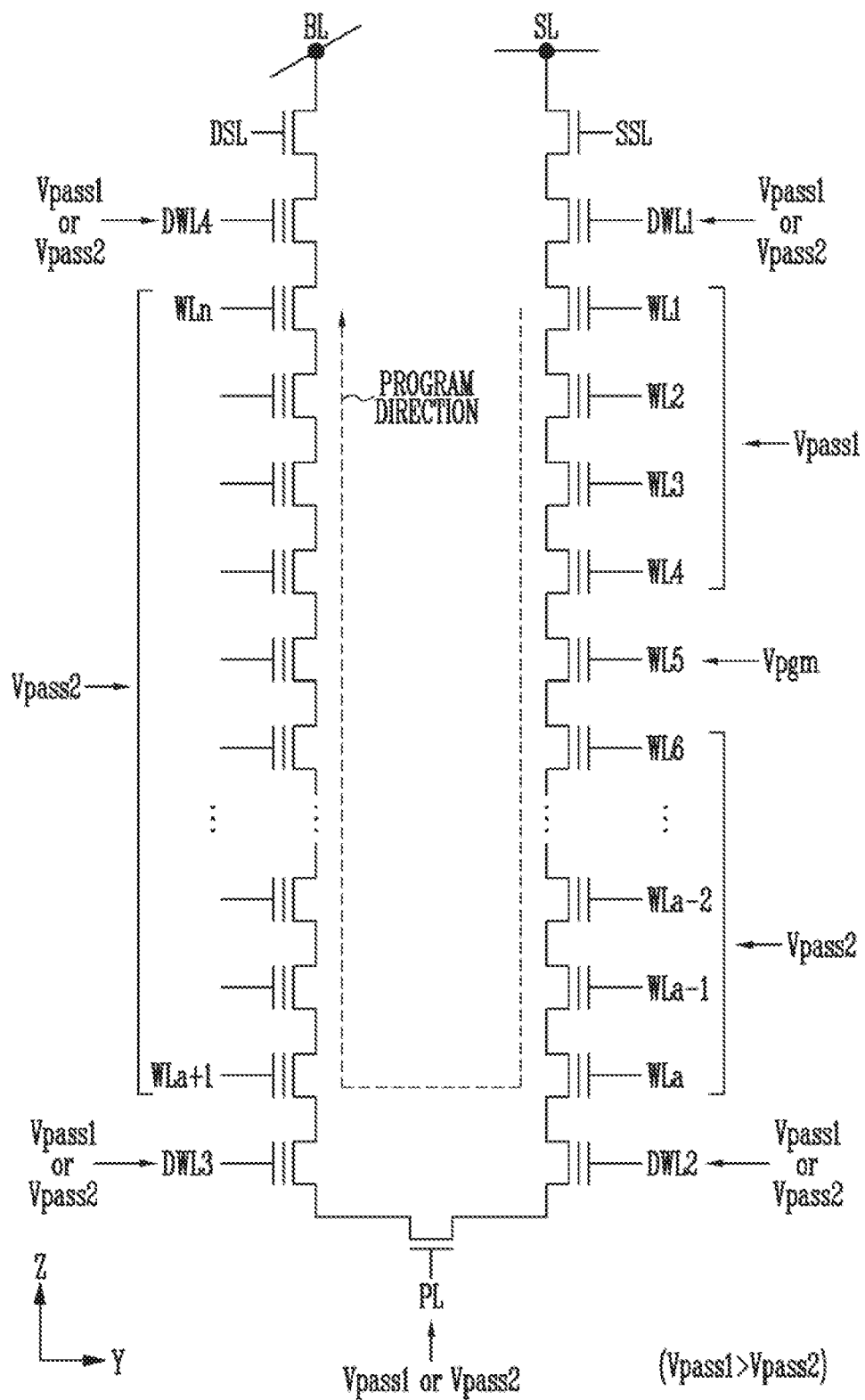
FIG. 14 is a diagram for explaining an example of a program operation of FIG. 13.

FIG. 14 is a diagram for explaining an example of a program operation of FIG. 13.

Referring to FIG. 14, in this example it is assumed that a program operation is sequentially performed from a first word line WL1 to an a-th word line WLa, and is sequentially performed from an a+1-th word line WLa+1 to an n-th word line WLn.

When a fifth word line WL5 is a word line coupled to a selected page, pages to which the first to fourth word lines WL1 to WL4 are coupled may be pages on which a program has already been performed, and pages to which the sixth to n-th word lines WL6 to WLn are coupled may be pages on which the program operation has not been performed. Therefore, when the program voltage Vpgm is applied to the word line WL5 coupled to the selected page, a first pass voltage Vpass1 may be applied to the first to fourth word lines WL1 to WL4, and a second pass voltage Vpass2 lower than the first pass voltage may be applied to the sixth to n-th word lines WL6 to WLn. The first and second pass voltages Vpass1 and Vpass2 may be set to voltages that are higher than 0 V and are lower than the program voltage Vpgm.

Further, if dummy cells are included in a string, the first or second pass voltage Vpass1 or Vpass2 may be applied to dummy lines DWL1 to DWL4 coupled to the dummy cells when the program voltage Vpgm is applied to the selected word line WL5 coupled to the selected page.

Further, when a program operation is performed in a direction opposite the program direction illustrated in FIG. 14, the first or second pass voltage Vpass1 or Vpass2 may be applied to unselected word lines, as described above with reference to FIG. 7.

Figure 15:
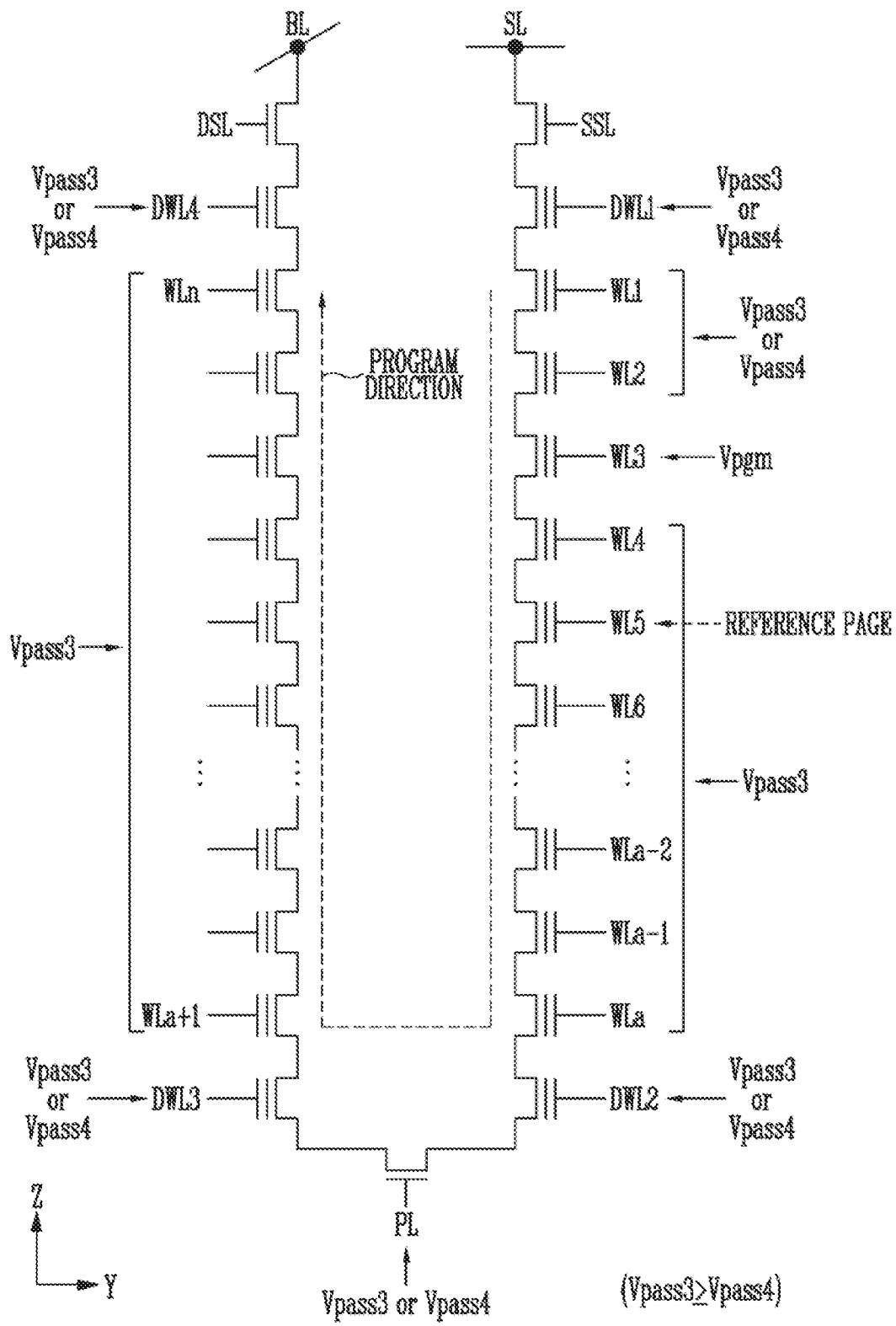
FIGS. 15 and 16 are diagrams for explaining an example of a program operation of FIG. 13.
Figure 16:
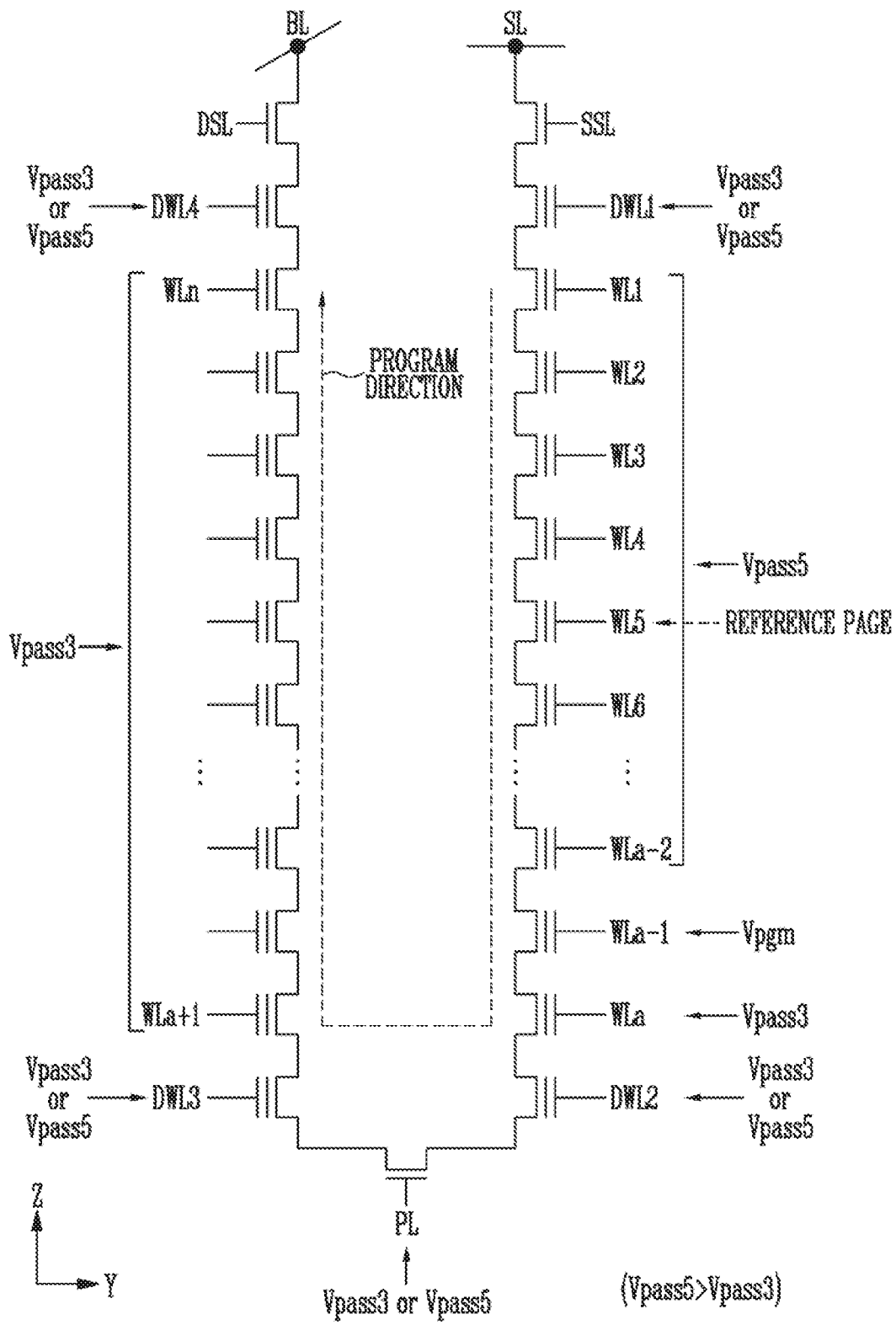

FIGS. 15 and 16 are diagrams for explaining an example of the program operation of FIG. 13.

Referring to FIG. 15, a reference page may be set as in the case of the program operation, described above with reference to FIG. 10. In this example, it is assumed that a page coupled to a fifth word line WL5 is set as the reference page, and that a program operation is sequentially performed from a first word line WL1 to an a-th word line WLa and is sequentially performed from an a+1-th word line WLa+1 to an n-th word line WLn.

When the third word line WL3 is a word line coupled to the selected page, pages to which the first and second word lines WL1 and WL2 are coupled may be pages on which the program operation has already been performed, and pages to which the fourth to n-th word lines WL4 to WLn are coupled may be pages on which the program operation has not been performed. Therefore, when a program voltage Vpgm is applied to the word line WL3 coupled to the selected page, a third pass voltage Vpass3 or a fourth pass voltage Vpass4 may be applied to the first and second word lines WL1 and WL2, and the third pass voltage Vpass3 may be applied to the fourth to n-th word lines WL4 to WLn. The third and fourth pass voltages Vpass3 and Vpass4 may be set to voltages that are higher than 0 V and are lower than the program voltage Vpgm, and the fourth pass voltage Vpass4 may be set to a voltage that is less than or equal to the third pass voltage Vpass3.

Further, if dummy cells are included in a string, the third or fourth pass voltage Vpass3 or Vpass4 may be applied to dummy lines DWL1 to DWL4 coupled to the dummy cells when the program voltage Vpgm is applied to the selected word line WL3.

Referring to FIG. 16, in this example it is assumed that a page to which the fifth word line WL5 is coupled is set as a reference page, and that a program operation is sequentially performed from the first word line WL1 to the a-th word line WLa and is sequentially performed from the a+1-th word line WLa+1 to the n-th word line WLn.

When an a−1-th word line WLa−1 is a word line coupled to the selected page, pages to which the first to a−2-th word lines WL1 to WLa−2 are coupled may be pages on which a program operation has already been performed, and pages to which the a-th to n-th word lines WLa to WLn are coupled may be pages on which the program operation has not been performed. Therefore, when a program voltage Vpgm is applied to the word line WLa−1 coupled to the selected page, a fifth pass voltage Vpass5 may be applied to the first to a−2-th word lines WL1 to WLa−2, and a third pass voltage Vpass3 may be applied to the a-th to n-th word lines WLa to WLn. The third and fifth pass voltages Vpass3 and Vpass5 may be set to voltages that are higher than 0 V and are lower than the program voltage Vpgm, and the third pass voltage Vpass3 may be set to a voltage that is lower than the fifth pass voltage Vpass5.

Further, if dummy cells are included in a string, the third or fifth pass voltage Vpass3 or Vpass5 may be applied to dummy lines DWL1 to DWL4 coupled to the dummy cells when the program voltage Vpgm is applied to the selected word line WLa−1.

Figure 17:
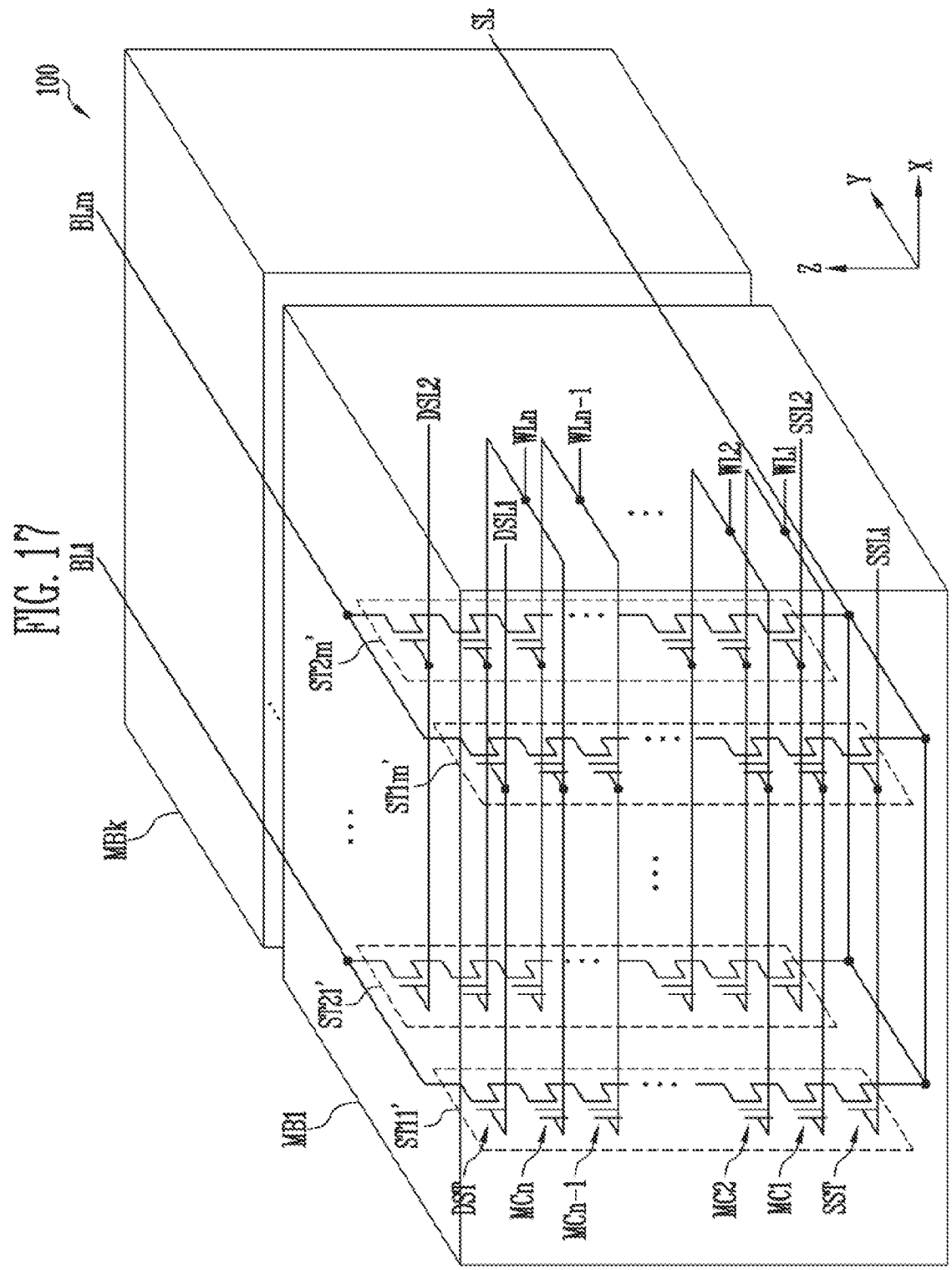
FIG. 17 is a diagram for explaining an embodiment of a 3D memory block.

FIG. 17 is a diagram for explaining an embodiment of a 3D memory block.

Referring to FIG. 17, a memory cell array 100 may include a plurality of memory blocks MB1 to MBk. The internal configuration of the first memory block MB1 is illustrated in FIG. 17 to help in the understanding of the disclosure, and the internal configuration of the remaining memory blocks MB2 to MBk is omitted. The second to k-th memory blocks MB2 to MBk may have the same configuration as the first memory block MB1.

The first memory block MB1 may include a plurality of strings ST11' to ST1*m*' and ST21' to ST2*m*'. Each of the plurality of strings ST11' to ST1*m*' and ST21' to ST2*m*' may be extended along a Z direction. In the first memory block MB1, m strings may be arranged in an X direction. Although two strings are illustrated as being arranged in a Y direction in FIG. 17, this illustration is merely made for the convenience of description, and three or more strings may be arranged in a column direction.

Each of the strings ST11' to ST1*m*' and ST21' to ST2*m*' may include at least one source select transistor SST, first to n-th memory cells MC1 to MCn, and at least one drain select transistor DST.

The source select transistor SST of each string may be coupled between a source line SL and the memory cells MC1 to MCn. The source select transistors of strings arranged in the same row may be coupled to the same source select line. The source select transistors of the strings ST11' to ST1*m*' arranged in a first row may be coupled to a first source select line SSL1. The source select transistors of the strings ST21' to ST2*m*' arranged in a second row may be coupled to a second source select line SSL2. In other embodiments, the source select transistors of the strings ST11' to ST1*m*' and ST21' to ST2*m*' may be coupled in common to a single source select line.

The first to n-th memory cells MC1 to MCn in each string may be connected in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell.

When the dummy memory cell is provided, the voltage or current of the corresponding string may be stably controlled. Accordingly, the reliability of data stored in the memory block MB1 may be improved.

The drain select transistor DST of each string may be coupled between the corresponding bit line and the memory cells MC1 to MCn. The drain select transistors DST of strings arranged in a row direction may be coupled to drain select lines extended in the row direction. The drain select transistors DST of the strings ST11' to ST1m' in a first row may be coupled to a first drain select line DSL1. The drain select transistors DST of the strings ST21' to ST2m' in a second row may be coupled to a second drain select line DSL2.

Consequently, the memory block MB1 of FIG. 17 may have an equivalent circuit similar to that of the memory block MB1 of FIG. 13 except that a pipe transistor PT is excluded from each string.

Figure 18:
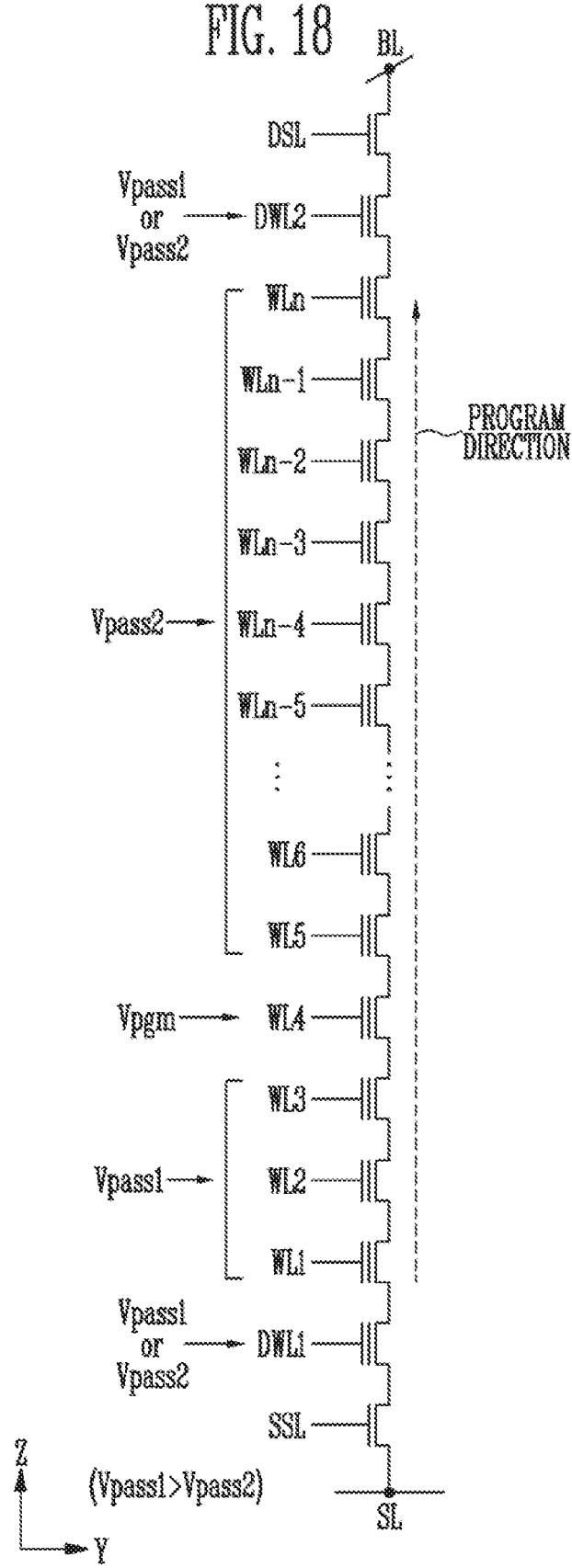
FIG. 18 is a diagram for explaining an example of a program operation of FIG. 17.

FIG. 18 is a diagram for explaining an example of the program operation of FIG. 17.

Referring to FIG. 18, in this example it is assumed that a program operation is sequentially performed from a first word line WL1 to an n-th word line WLn.

When a fourth word line WL4 is a word line coupled to a selected page, pages to which first to third word lines WL1 to WL3 are coupled may be pages on which a program operation has already been performed, and pages to which fifth to n-th word lines WL5 to WLn are coupled may be pages on which the program operation has not been performed. Therefore, when a program voltage Vpgm is applied to the word line WL4 coupled to the selected page, a first pass voltage Vpass1 may be applied to the first to third word lines WL1 to WL3, and a second pass voltage Vpass2 lower than the first pass voltage may be applied to the fifth to n-th word lines WL5 to WLn. The first and second pass voltages Vpass1 and Vpass2 may be set to voltages that are higher than 0 V and are lower than the program voltage Vpgm.

Further, if dummy cells are included in a string, the first or second pass voltage Vpass1 or Vpass2 may be applied to dummy lines DWL1 and DWL2 coupled to the dummy cells when the program voltage Vpgm is applied to the selected word line WL4.

Furthermore, when the program operation is performed in a direction opposite the program direction illustrated in FIG. 18, the first or second pass voltage Vpass1 or Vpass2 may be applied to unselected word lines, as described above with reference to FIG. 7.

Figure 19:
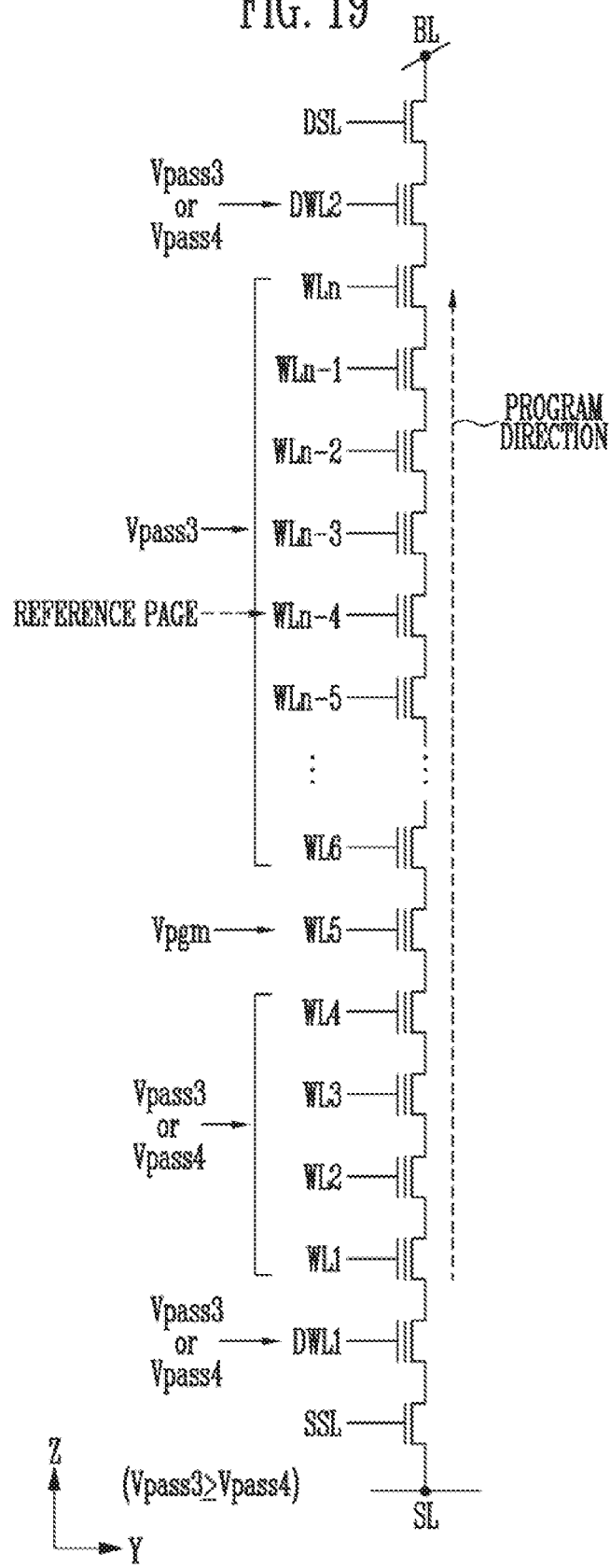
FIGS. 19 and 20 are diagrams for explaining an example of a program operation of FIG. 17.
Figure 20:
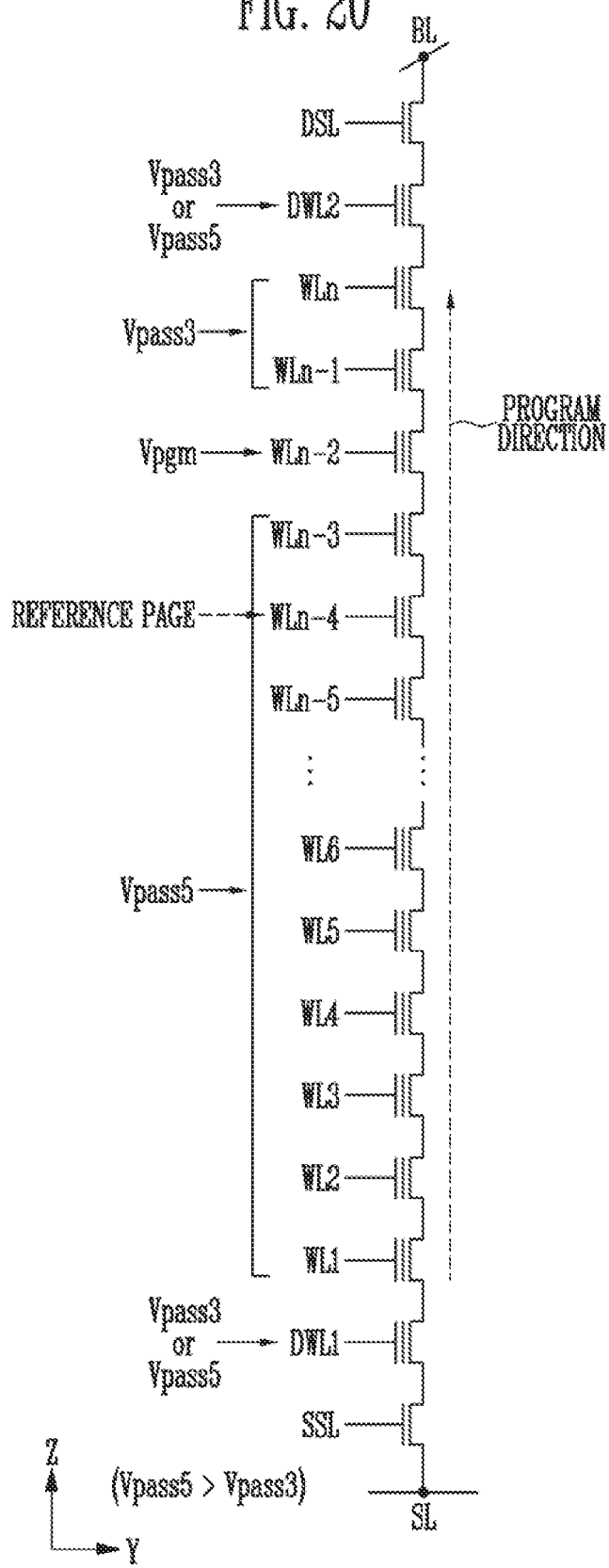

FIGS. 19 and 20 are diagrams for explaining an example of the program operation of FIG. 17.

Referring to FIG. 19, a reference page may be set as in the case of the program operation, described above with reference to FIG. 10. For example, it is assumed that a page to which an n−4-th word line WLn−4 is coupled is set as the reference page, and that a program operation is sequentially performed from a first word line WL1 to an n-th word line WLn.

When the fifth word line WL5 is a word line coupled to the selected page, pages to which the first to fourth word lines WL1 to WL4 are coupled may be pages on which a program operation has already been performed, and pages to which the sixth to n-th word lines WL6 to WLn are coupled may be pages on which the program operation has not been performed. Therefore, when a program voltage Vpgm is applied to the word line WL5 coupled to the selected page, a third pass voltage Vpass3 or a fourth pass voltage Vpass4 may be applied to the first to fourth word lines WL1 to WL4, and the third pass voltage Vpass3 may be applied to the sixth to n-th word lines WL6 to WLn. The third and fourth pass voltages Vpass3 and Vpass4 may be set to voltages that are higher than 0 V and are lower than the program voltage Vpgm, and the fourth pass voltage Vpass4 may be set to a voltage that is less than or equal to the third pass voltage Vpass3.

Further, if dummy cells are included in a string, the third or fourth pass voltage Vpass3 or Vpass4 may be applied to dummy lines DWL1 and DWL2 coupled to the dummy cells when the program voltage Vpgm is applied to the selected word line WL5.

Referring to FIG. 20, it is assumed that a page to which the n−4-th word line WLn−4 is coupled is set as a reference page, and that a program operation is sequentially performed from the first word line WL1 to the n-th word line WLn.

When the n−2-th word line WLn−2 is a word line coupled to the selected page, pages to which the first to n−3-th word lines WL1 to WLn−3 are coupled may be pages on which a program operation has already been performed, and pages to which the n−1-th and n-th word lines WLn−1 and WLn are coupled may be pages on which the program operation has not been performed. Therefore, when a program voltage Vpgm is applied to the word line WLn−2 coupled to the selected page, a fifth pass voltage Vpass5 may be applied to the first to n−3-th word lines WL1 to WLn−3, and a third pass voltage Vpass3 may be applied to the n−1-th and n-th word lines WLn−1 and WLn. The third and fifth pass voltages Vpass3 and Vpass5 may be set to voltages that are higher than 0 V and are lower than the program voltage Vpgm, and the third pass voltage Vpass3 may be set to a voltage that is lower than the fifth pass voltage Vpass5.

Further, if dummy cells are included in a string, the third or fifth pass voltage Vpass3 or Vpass5 may be applied to dummy lines DWL1 and DWL2 coupled to the dummy cells when the program voltage Vpgm is applied to the selected word line WLn−2.

As described above, when the pass voltage is adjusted depending on whether unselected pages have been programmed during a program operation, variation in the threshold voltages of programmed memory cells may be suppressed, and a program disturb phenomenon may be reduced. For this operation, each of the above-described embodiments may be performed singly or in combination with some embodiments. Therefore, the reliability of the program operation of the memory device may be improved.

Figure 21:
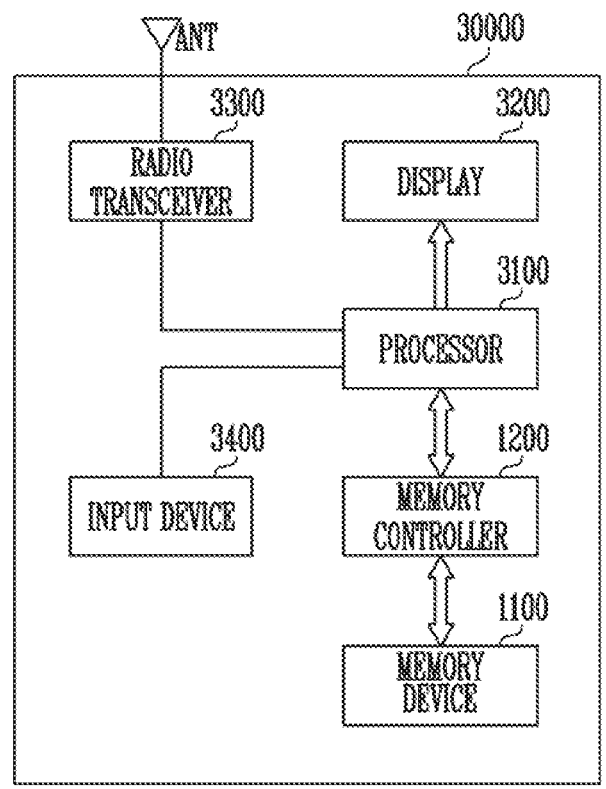
FIG. 21 is a diagram for explaining an embodiment of a memory system including the memory device of FIG. 2.

FIG. 21 is a diagram illustrating an embodiment of a memory system including the memory device shown in FIG. 2.

Referring to FIG. 21, a memory system 30000 may be embodied in a cellular phone, a smartphone, a tablet PC, a personal digital assistant (PDA), or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under control of a processor 3100.

Data programmed in the memory device 1100 may be output through a display 3200 under control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 22:
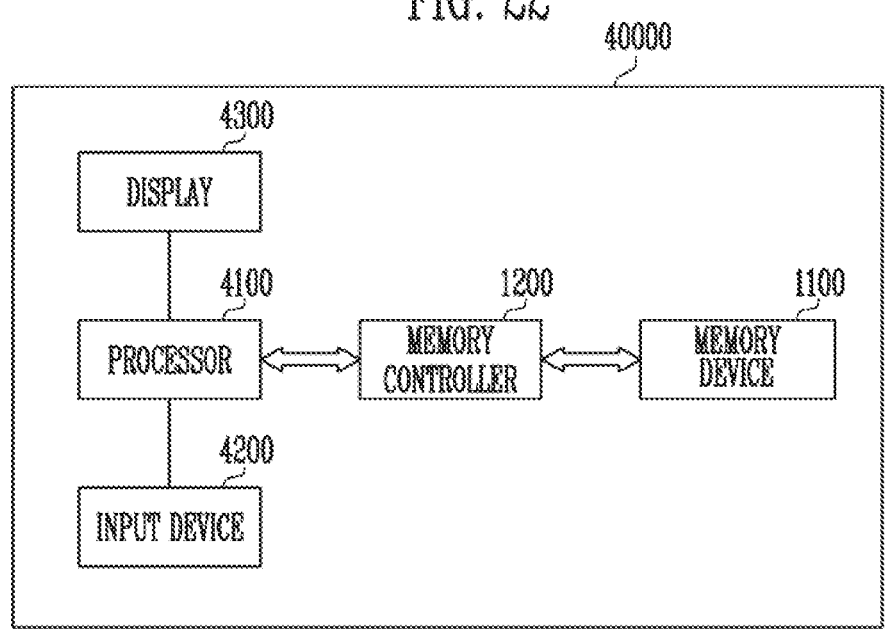
FIG. 22 is a diagram for explaining an embodiment of a memory system including the memory device of FIG. 2.

FIG. 22 is a diagram illustrating an embodiment of a memory system including the memory device shown in FIG. 2.

Referring to FIG. 22, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a pointing device such as a touch pad or a computer mouse, a keypad, or a keyboard.

The processor 4100 may control overall operation of the memory system 40000 and control operation of the memory controller 1200. In an embodiment, the memory controller 1200 capable of controlling operation of the memory device 1100 may be implemented as a part of the processor 4100 or a chip provided separately from the processor 4100.

Figure 23:
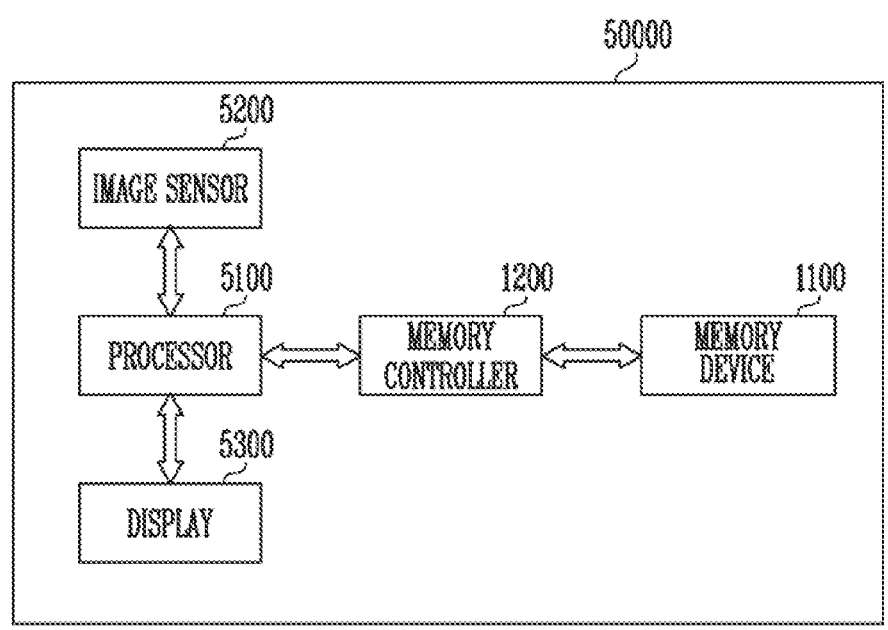
FIG. 23 is a diagram for explaining an embodiment of a memory system including the memory device of FIG. 2.

FIG. 23 is a diagram illustrating an embodiment of a memory system including the memory device shown in FIG. 2.

Referring to FIG. 23, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling operation of the memory device 1100 may be implemented as a part of the processor 5100, or a chip provided separately from the processor 5100.

Figure 24:
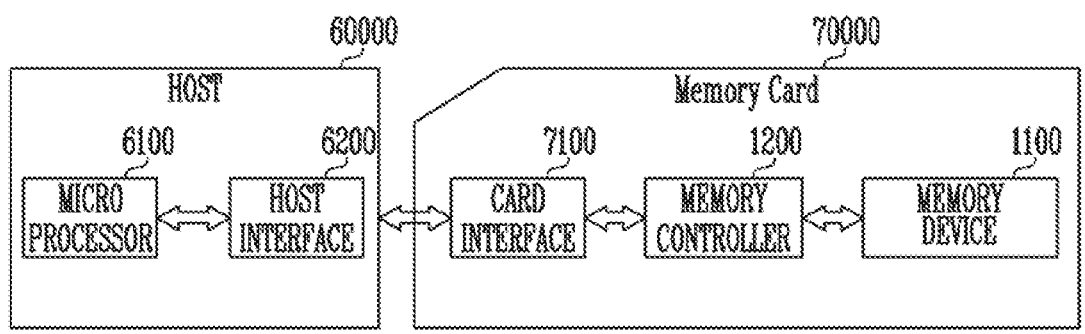
FIG. 24 is a diagram for explaining an embodiment of a memory system including the memory device of FIG. 2.

FIG. 24 is a diagram illustrating an embodiment of a memory system including the memory device shown in FIG. 2.

Referring to FIG. 24, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may improve the reliability of the program operation of a memory device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device, comprising:
a first select line and a second select line;
a plurality of word lines disposed between the first and second select lines, wherein one of the word lines is set as a reference word line which is fixed in a memory block during a program operation;
peripheral circuits configured to generate a program voltage and first to third pass voltages for the program operation, wherein the first pass voltage is greater than the second pass voltage, the third pass voltage is greater than the first pass voltage, and the program voltage is greater than the third pass voltage; and
a control logic configured to control the peripheral circuits to perform the program operation on a memory cell in a direction from the first select line to the second select line,
wherein the first or second pass voltage is applied to unselected word lines between the first select line and a selected word line which is varied during the program operation, and the first pass voltage is applied to unselected word lines between the selected word line and the second select line, before the selected word line reaches the reference word line when the program operation is performed, and wherein the third pass voltage is applied to unselected word lines between the first select line and the selected word line, and the first pass voltage is applied to unselected word lines between the selected word line and the second select line, after the selected word line has reached the reference word line when the program operation is performed.

2. The memory device according to claim 1, wherein the program voltage and the first to third pass voltages are higher than 0V.

3. The memory device according to claim 1, wherein the reference word line is set in consideration of a time required for the memory cell to be stabilized during a test operation.

4. The memory device according to claim 3, wherein the time required for the memory cell coupled to the selected word line to be stabilized is a time required for a movement of electrons trapped in the memory cell to be suppressed.

* * * * *